US00RE37419B1

(19) United States
(12) Reissued Patent
Hsu et al.

(10) Patent Number: US RE37,419 E
(45) Date of Reissued Patent: Oct. 23, 2001

(54) FLASH MEMORY ARRAY AND DECODING ARCHITECTURE

(75) Inventors: Fu-Change Hsu; Hsing-Ya Tsao, both of Taipei (TW); Peter W. Lee, Saratoga, CA (US)

(73) Assignee: Aplus Flash Technology Inc., San Jose, CA (US)

(21) Appl. No.: 09/430,060

(22) Filed: Oct. 29, 1999

Related U.S. Patent Documents

Reissue of:
(64) Patent No.: 5,953,250
Issued: Sep. 14, 1999
Appl. No.: 09/159,830
Filed: Sep. 24, 1998

(63) Continuation-in-part of application No. 09/036,867, filed on Mar. 9, 1998, now abandoned, which is a continuation-in-part of application No. 08/872,475, filed on Jun. 5, 1997, now Pat. No. 5,777,924.

(60) Provisional application No. 60/094,573, filed on Jul. 29, 1998.

(51) Int. Cl.[7] ..... G11C 16/04; G11C 16/06

(52) U.S. Cl. ..... 365/185.11; 365/185.05; 365/185.23

(58) Field of Search ..... 365/185.11, 185.05, 365/185.29, 185.33; 438/258

(56) References Cited

U.S. PATENT DOCUMENTS 4,949,309 * 8/1990 Rao ..... 365/185.33
5,200,922 * 4/1993 Rao ..... 365/185.11
5,546,402 * 8/1996 Niijima et al. ..... 365/185.11
5,548,551 * 8/1996 Wang et al. ..... 365/185.23
5,597,750 * 1/1997 Pio et al. ..... 438/258
5,646,890 * 7/1997 Lee et al. ..... 365/185.11
5,671,177 * 9/1997 Ueki ..... 365/185.11
5,687,121 * 11/1997 Lee et al. ..... 365/185.11
5,822,252 * 10/1998 Lee et al. ..... 365/185.23
6,031,765 * 2/2000 Lee et al. ..... 365/185.29

* cited by examiner

*Primary Examiner*—Trong Phan
(74) *Attorney, Agent, or Firm*—Flehr Hohbach Test Albritton & Herbert LLP

(57) ABSTRACT

A flash memory circuit includes a word line decoder with even and odd word line latches and a source line decoder with a source line latch. The word line decoders and the source line decoder provide the capability of erasing the memory cells of two adjacent word lines in a flash memory simultaneously and a verifying the memory cells word line by word line. By erasing two adjacent rows simultaneously, the embodiments of this invention eliminate over-erasure and source disturbance problems associated with conventional flash memory circuits. The decoding architecture provides flexible erase size that may be from a pair to a large number of multiple pairs of word lines. By dividing the memory cells of a word line into a number of segments and having segmented source lines controlled by source segment control lines and transistors, the decoding circuit further provides the capability of selecting the memory cells of a word line segment for erasing. Several different approaches are presented for the layout of source segment control lines and transistors as well as the word lines.

14 Claims, 18 Drawing Sheets

| | XD1, 2 | | XS | XT | | XTB | | WL | | SLX | | SLY | ST | | STB | | SL | |
|---|---|---|---|---|---|---|---|---|---|---|---|---|---|---|---|---|---|---|
| | SEL | NON-SEL | | SEL | NON-SEL | SEL | NON-SEL | SEL | NON-SEL | SEL | NON-SEL | SEL NON-SEL | SEL | NON-SEL | SEL | NON-SEL | SEL | NON-SEL |
| ERASE | -8V | 0V | 0V | 0V | -8V | +6V | 0V | -8V | 0V/-Vx | +5V | 0V | FLOAT-ING | +6V | 0V | 0V | +6V | +5V | 0V |
| ERASE -VERIFY | +1.5V | -Vx | 0V | Vdd | -Vx | +6V | 0V | +1.5V | 0V/-Vx | +5V | 0V | 0V | +6V | 0V | 0V | +6V | 0V | 0V |
| OVER-ERASE-VERIFY | +0.5V | -Vx | 0V | Vdd | -Vx | Vdd | 0V | +0.5V | 0V/-Vx | 0V | 0V | 0V | Vdd | 0V | Vdd | 0V | 0V | 0V |
| REPAIR | +5V | -Vx | 0V | +5V | -Vx | Vdd | 0V | +5V | 0V/-Vx | 0V | 0V | 0V | Vdd | 0V | Vdd | 0V | 0V | 0V |
| PROGRAM | +8V | 0V | 0V | +8V | 0V | Vdd | 0V | +8V | 0V | 0V | 0V | 0V | Vdd | 0V | Vdd | 0V | 0V | 0V |
| PROGRAM -VERIFY | +4.5V | 0V | 0V | Vdd | 0V | Vdd | 0V | +4.5V | 0V | 0V | 0V | 0V | Vdd | 0V | Vdd | 0V | 0V | 0V |
| READ | Vdd | 0V | 0V | Vdd | 0V | Vdd | 0V | Vdd | 0V | 0V | 0V | 0V | Vdd | 0V | Vdd | 0V | 0V | 0V |

FIGURE 3b

| | XD | | XS | | XT | | XTB | | WL | | SLX | | ST | | STB | | SL | |
|---|---|---|---|---|---|---|---|---|---|---|---|---|---|---|---|---|---|---|
| | SEL | NON-SEL | SEL | NON-SEL | SEL | NON-SEL | SEL | NON-SEL | SEL | NON-SEL | SEL | NON-SEL | SEL | NON-SEL | SEL | NON-SEL | SEL | NON-SEL |
| MULTI-BLOCK ERASE | 0V | -8V | -8V | 0V | 0V | 0V | 0V | 0V | -8V | 0V | +5V | 0V | +6V | 0V | 0V | +6V | +5V | 0V |
| SMALL-SECTOR ERASE | -8V | -8V | -8V | 0V | -8V | 0V | +1V | -8V | -8V | 0V | +5V | 0V | +6V | 0V | 0V | +6V | +5V | 0V |
| ERASE-VERIFY | -VT | 0V | -VT | 0V | +1.5V | -VT | -VT | +1.5V | +1.5V | -VT/0V | +5V | 0V | +6V | 0V | 0V | +6V | 0V | 0V |
| OVER-ERASE-VERIFY | -VT | 0V | -VT | 0V | +0.5V | -VT | -VT | +0.5V | +0.5V | -VT/0V | 0V | 0V | Vdd | 0V | 0V | Vdd | 0V | 0V |
| REPAIR | -VT | 0V | -VT | 0V | +5V | -VT | -VT | +5V | +5V | -VT/0V | 0V | 0V | Vdd | 0V | 0V | Vdd | 0V | 0V |
| PROGRAM | 0V | +8V | 0V | 0V | +8V | 0V | 0V | +8V | +8V | 0V | 0V | 0V | Vdd | 0V | 0V | Vdd | 0V | 0V |
| PROGRAM-VERIFY | 0V | +4.5V | 0V | 0V | +4.5V | 0V | 0V | +4.5V | +4.5V | 0V | 0V | 0V | Vdd | 0V | 0V | Vdd | 0V | 0V |
| READ | 0V | Vdd | 0V | 0V | Vdd | 0V | 0V | Vdd | Vdd | 0V | 0V | 0V | Vdd | 0V | 0V | Vdd | 0V | 0V |

FIGURE 5b

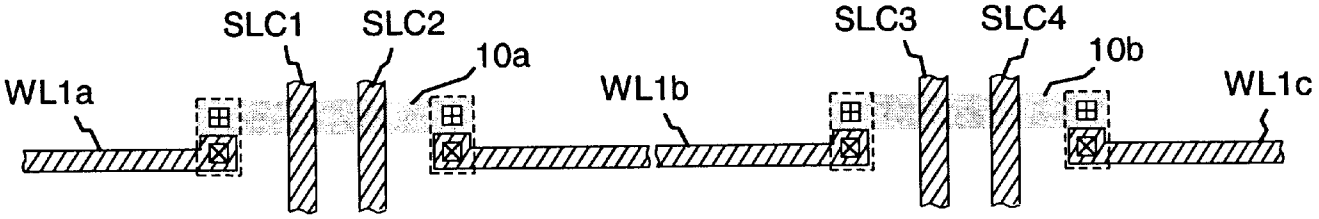
FIG.15a
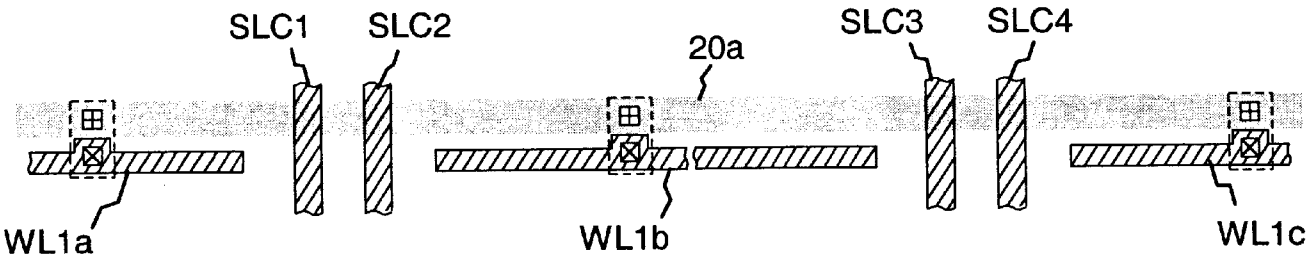
FIG.15b
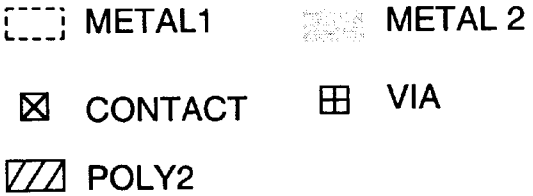

FLASH MEMORY ARRAY AND DECODING ARCHITECTURE

Matter enclosed in heavy brackets [ ] appears in the original patent but forms no part of this reissue specification; matter printed in italics indicates the additions made by reissue.

This is a continuation-in-part of Ser. No. 09/036,867, filed Mar. 9, 1998, now abandoned, which was a continuation-in-part of Ser. No. 08/872,475, filed Jun. 5, 1997, now U.S. Pat. No. 5,777,924, granted Jul. 7, 1998. This application also claims the benefit of U.S. Provisional Ser. No. 60/094,573, filed Jul. 29, 1998.

FIELD OF INVENTION

The present invention relates to the design and circuit structure of a flash memory, and more specifically to the layout of word line and source line decoders of a flash memory.

BACKGROUND OF THE INVENTION

In recent years, flash memory devices have been widely used in computer related equipment and other electronic appliances as storage devices. The nonvolatile and on-chip programmable capabilities of a flash memory are very important for storing data in many applications. As an example, flash memories are frequently used for the BIOS storage of a personal computer. In addition, the small physical size of flash memories also makes them very suitable for portable applications. Therefore, they have been used for storing programs and data for many portable electronic devices such as cellular phones, digital cameras and video game platforms.

Different from a normal random access memory (RAM) that can be randomly read, erased and programmed on a byte basis, a conventional EPROM-type flash memory features a byte-program and a block-erase capability with each block containing a number of bytes. Because the data within a memory block can not be selected for erasure individually, a flash memory has to erase the data of a whole block of memory cells, i.e., an erase block, and then program the new data byte by byte. The block erase scheme, however, not only is inflexible but also has an undesirable problem called over-erasure. The over-erasure results from the inherent difference between the speed of erasing of each memory cell. Because a large number of cells are erased together, the cells having the fast speed of erasing may be over-erased below 0V, while the cells having slow speed are not successfully erased yet. The over-erased cells will conduct leakage current and cause the malfunction of bit line (BL) sense amplifiers.

To add more flexibility for erasing memory cells, isolate non-selected memory cells and avoid disturbance of data, U.S. Pat. No. 5,548,551 provides a negative voltage decoder for erasing either one memory cell or a block of memory cells for a non-volatile memory. In practical applications, however, it is desired that a small (multiple bytes) and flexible (random and multiple word lines) erase size for the erase operation of a flash memory can be accomplished without any memory disturbance and over-erasure problems.

SUMMARY OF THE INVENTION

This invention has been made to overcome the above mentioned drawbacks of a conventional flash memory. The primary object of this invention is to provide a circuit structure that offers the capability of erasing memory cells on a small and flexible number of word lines of a flash memory. Another object of this invention is to provide a method of erasing a multiple number of word line pairs simultaneously as well as verifying each individual word line one at time. Yet another object of this invention is to provide a memory circuit structure and methods of operating the memory circuit to eliminate the memory disturbance and over-erasure problems that often occur in a conventional flash memory circuit. A further objects of this invention is to provide a source line circuit having segmented source lines so that the flash memory cells of a small segment in a word line can be erased without source disturbance. It is also an object of the invention to provide a new bias condition for erasing one of more segments in a word line and reduce the gate disturbance to non-selected segments. It is also another object of the invention to provide a novel erase operation flow to reduce the over-erasure and disturbance for achieving accurate memory cell's threshold voltage control.

The memory cells of the flash memory circuit of this invention are divided into a number of banks. The memory cells in each memory bank are organized as a plurality of rows and a plurality of columns. The sources of the memory cells of two adjacent rows are wired together and connected to a common source line. Each memory bank of this invention has its own word line decoder and source line decoder. The source line decoder has a source line latch associated with it for providing desired voltage levels under various memory operations. Address lines to the word line decoder and the source line decoder choose the selected word line and source line for memory operations.

In a first preferred embodiment, each word line decoder has both odd and even word line latches associated with it. For the erase operation, the preferred mode of operation of this invention is to select two adjacent word lines which share the common source line from each memory bank for erasing. When the memory cells of the two adjacent word lines are erased, negative voltages of around −10V can be applied through the word line latches to both word lines and a positive voltage such as 5V can be applied through the source line latch to provide an appropriate bias condition for the erase operation. When the memory cells are erase-verified, the word line under verification can be applied a verifying voltage through one word line latch while the other word line latch can provide a low voltage sufficient enough to cut off the over-erased memory cells on the other word line that is not under verification. Therefore, the false reading that usually exists in verifying a single word line is eliminated. In addition, each word line can be stopped erasing after being verified by applying appropriate voltage through its associated word line latch to reduce the over-erase problem. According to the embodiment, a multiple number of memory banks each having two word lines that share the same source line for erasing can be erased simultaneously with one erase operation. The erase size can be from a word line pair to a large number of multiple word line pairs.

In a second embodiment of this invention, there are also two latches associated with the decoder. One of the latches controls if the word line voltage of a selected memory row is provided by either the other latch or by the address lines. By supplying appropriate voltages to the address lines and the latches, a multiple pairs of word lines in a memory bank can be erased simultaneously and verified one by one properly. Nevertheless, if all the word lines in a memory bank are selected for erasing, any other memory bank can only have all its word lines erased or not at the same time because the address lines that may also provide word line voltages for this embodiment are shared by all memory banks. Therefore, for the erase operation, the preferred mode is to erase a multiple pairs of word lines less than the size of a memory bank in one erase operation or to erase a multiple memory banks simultaneously.

Two additional embodiments provide similar functions to the second embodiment are also disclosed. The third embodiment uses an additional latch for controlling how the word line voltage is supplied. With the additional latch, the device of a control circuit of the word line decoder can be better protected under certain conditions. The fourth embodiment which also uses an additional latch reduces the address lines required for both the word line decoder and the source line decoder to a half. The flexibility and preferred mode of operation for the two embodiments are the same as that of the second embodiment.

This invention also presents a source line circuit that allows the selection of the memory cells of a small segment in a row for erasing. By dividing the memory array of a memory bank into a number of segments each comprising a number of columns, the sources of the memory cells of two adjacent rows in a segment can be wired together to form a segmented source line. Each segmented source line on the same word line is connected to a shared source line through a source segment control transistor having a gate coupled to a source segment control line. Therefore, the memory cells on a word line can be erased segment by segment.

The source segment control lines and source segment control transistors of this invention provide better flexibility for a flash memory device but they also increase the complexity of manufacturing the memory device. The partition of the control gates, the word lines as well as the source segment control transistors and source segment control lines into appropriate process layers for fabricating the device becomes critical. To achieve optimal device performance, this invention further discloses several preferred layout structures.

In one layout structure, the source segment control lines and transistors are formed in a polysilicon layer in which the floating gates of memory cells are also fabricated. In another layout structure, the source segment control lines and transistors are formed in a polysilicon layer which is different from and either above or below the polysilicon layer of forming the control gates of the memory cells. In an alternative layout, a word line is first formed by a number of word line segments in the polysilicon layer of the control gates and then connected by another conductive layer. The source segment control lines and transistors, therefore, can be formed in the same polysilicon layer of the control gates.

BRIEF DESCRIPTION OF THE DRAWINGS

FIG. 3b summarizes the control signals for the first embodiment of this invention under different memory operations.

FIG. 5b summarizes the control signals for the second embodiment of this invention under different memory operations.

FIG. 11 shows an exemplary layout for the memory array circuit of FIG. 10a.

FIG. 12 shows another layout for the memory array circuit of FIG. 10a.

FIG. 15a shows each two adjacent Poly2 word line segments being connected by a metal connector.

FIG. 15b shows that metal connectors for connecting Poly2 word line segments are in series and form a long metal line.

DETAILED DESCRIPTION OF THE INVENTION

Figure 1:
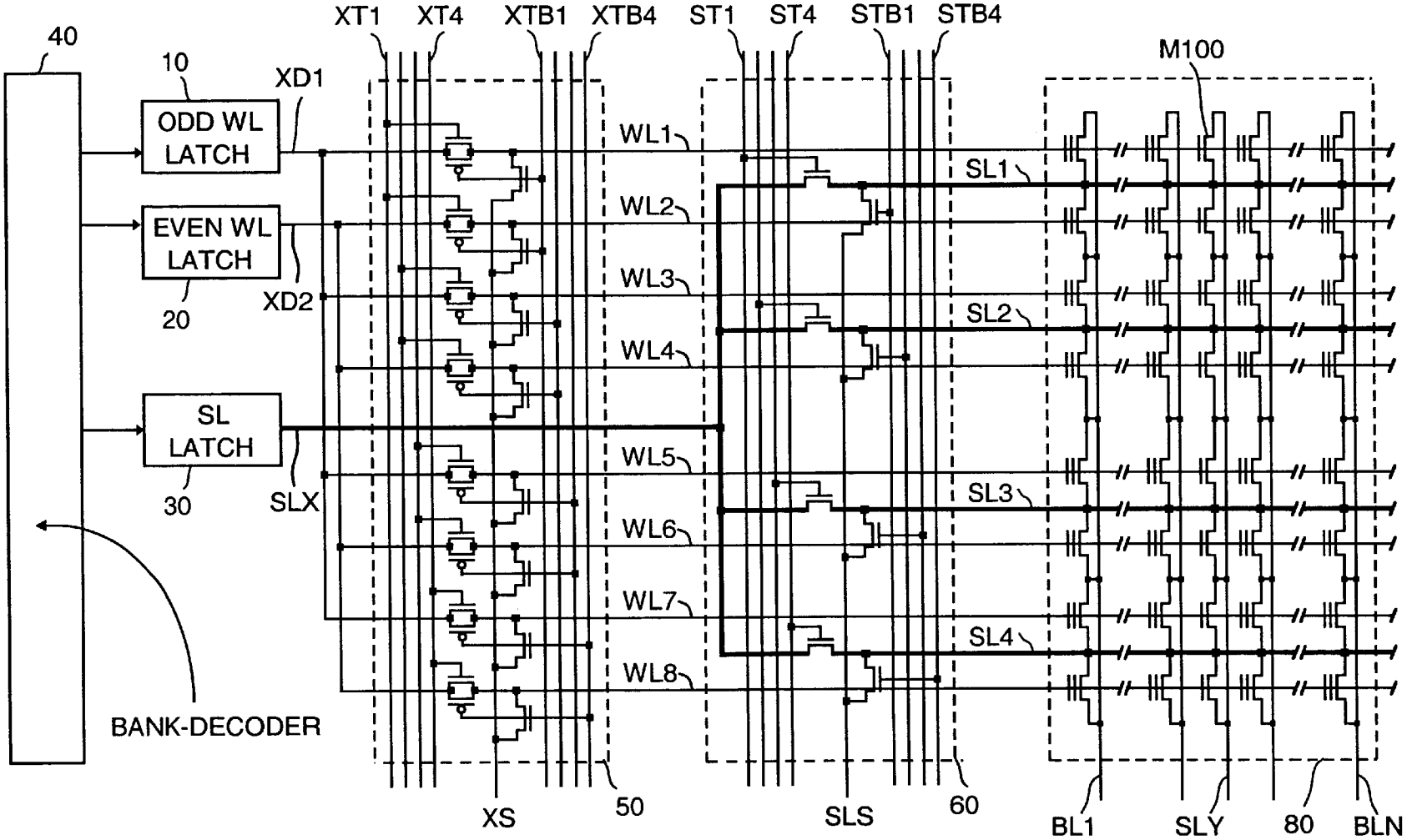
FIG. 1 shows a first embodiment of the circuit of a memory bank of the present invention including a bank decoder, a word line decoder with even and odd word line latch, and a source line decoder with a source line latch.

The present invention divides a flash memory into a plurality of memory banks. With reference to the first embodiment of this invention as shown in FIG. 1, the flash memory circuit comprises a word line (WL) decoder 50, a source line (SL) decoder 60 and a memory bank 80 having an array of memory cells. Each memory bank has an odd WL latch 10, an even WL latch 20 and an SL latch 30 associated with it. A bank decoder 40 for selecting different memory banks of the flash memory is also shown. The WL latches and the SL latch are controlled by the bank decoder. XT1~XT4 and XTB1~XTB4 are address lines that work with the WL decoder 50 to pass or block the voltages from the WL latches to the word lines. ST1~ST4 and STB1~STB4 are address lines that control the SL decoder 60 to pass or block the voltage from the SL latch to the source lines. An XS word control line is connected to a ground voltage in this embodiment.

By means of either the WL latch 10 or 20 and the SL latch 30, the decoder circuit as shown in FIG. 1 allows the erasure of the memory cells on a single word line by applying a negative voltage to the word line and a positive 5V voltage to the source line. (In general, a single word line may comprise 128 or 256 bytes.) However, in the flash memory design of the invention, two adjacent word lines share a same source line as shown in FIG. 1. For example, WL1 and WL2 share one source line SL1. If only WL1 is selected for erasing, erase disturbance may occur on the adjacent non-selected word line WL2. A method of overcoming the drawback of erasing a single selected WL is to read and store the programmed data of the memory cells on its adjacent WL before the erasing. During the erase-verification, the adjacent WL is turned off. After the selected WL has been successfully verified, the data of the memory cells of its source-disturbed adjacent WL after erasing are read and the previously stored data before erasing are retrieved. The read data and stored data are compared. If the data do not match, a program operation is performed to re-program the stored data to the disturbed memory cells. With this method, the circuit shown in the first embodiment of this invention has the flexibility of erasing any number of selected WLs as long as their adjacent WLs that may be disturbed are remembered first and restored later.

A preferred operation of the flash memory circuit of the first embodiment, however, is to simultaneously erase two adjacent WLs having a shared source line so that verification can be accomplished without disturbance. The odd and even WL latches 10, 20 of this invention provide the capability of erasing the memory cells on the two adjacent WLs altogether. If both odd and even WL latches in a selected memory bank apply negative voltages to a selected pair of WLs, and the SL latch in the selected memory bank applies a positive voltage to a selected SL, a pair of word lines can be erased simultaneously and then verified one by one as long as appropriate address signals are sent to the address lines.

All other WLs in the selected memory bank can be grounded through the word control line XS if they are not selected for erasing by the address lines. Similarly, non-selected SLs can also be grounded. Therefore, no memory cells other than the selected memory cells are affected by the biased voltages being applied for the erase operation. The memory disturbance problem is eliminated. In addition, each memory bank has its own odd and even WL latches as well as an SL latch, the erase operation can be applied independently without affecting other memory banks. Consequently, the erase size of the flash memory is very flexible and can be as small as a pair of WLs or a plurality of pairs of WLs. In addition, the memory banks selected for erasing can be almost randomly located anywhere within the flash memory.

To explain the operation of the WL decoder 50 in more detail, the decoder circuit is shown in FIG. 2 again. It can be seen that a p-n transistor pair and another n transistor control if each word line will be connected to a WL latch or grounded to the word control line XS. It is important to note that the preferred erase operation of this embodiment selects a plurality of memory banks with only a pair of WLs from each memory bank to erase if a multiple pairs of WLs are to be erased all at once. By doing so, the disturbance problem can be avoided. From the user's point of view, the logical addresses of the erased memory WLs may still be continuous. However, the bank decoder of this embodiment ensures that only one pair of WLs are selected from each physical memory bank. Although the circuit as shown in FIG. 1 can erase more than one pair of WLs in one memory bank at once, the advantage of this invention can not be fully realized unless only a pair of WLs from each memory bank are erased simultaneously.

Figure 2:
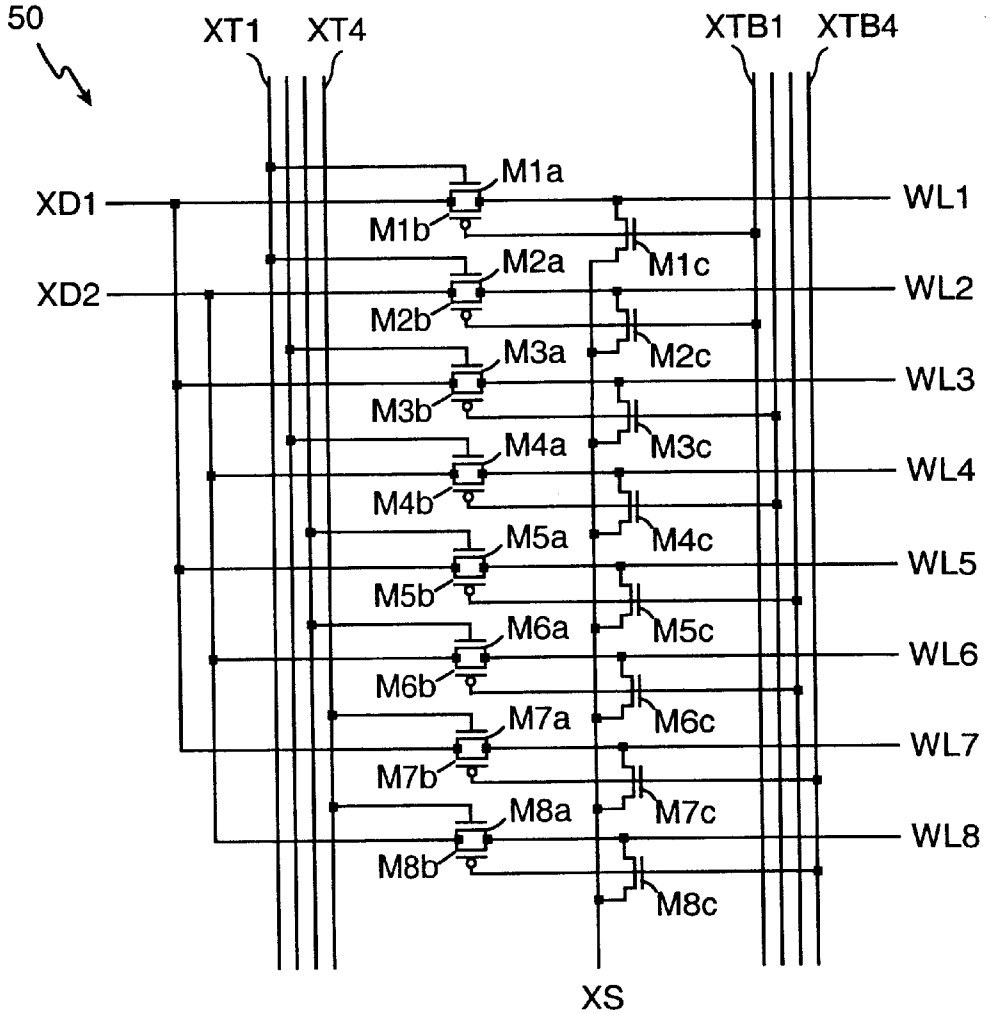
FIG. 2 shows the word line decoder circuit of the first embodiment shown in FIG. 1.

An example of erasing two pairs of WLs is used to explain the operational conditions of the decoder circuit shown in FIG. 2. It is assumed that both WL1 and WL2 of first and second memory banks are selected for erasing. The address lines are applied appropriate voltages to select WL1 and WL2, i.e., 0V for XT1, −8V for XT2~XT4, −8V for XTB1 and 0V for XTB2~XTB4. The XS line in this embodiment is always grounded. In the two selected memory banks, both odd and even WL latches apply −8V to XD1 and XD2 respectively. In the word line decoder 50, there are a plurality of word gating devices each having three transistors for controlling the connection of word lines. For example, WL1 is controlled by transistors M1a, M1b and M1c. Each word line can be connected to either a WL latch or the word control line XS. Under these bias conditions, M1a and M2a as well as M1b and M2b are turned on, and M1c and M2c are turned off to pass XD1 and XD2 to WL1 and WL2, M3a~M8a as well as M3b~M8b are turned off and M3c~M8c are turned on to pass the XS signal to WL3~WL8. Therefore, WL1 as well as WL2 are applied −8V for erasing and WL3~WL8 are grounded and not selected in both memory banks.

The source line decoder 60 comprises a plurality of source gating devices each having two transistors for controlling the connection of a source line to either the SL latch 30 or a source control line SLS. The address lines ST1~ST4 and STB1~STB4 controls the source gating devices for connecting one of the source lines to the SL latch 30. In general, ST1~ST4 have the same logic as XT1~XT4 but may have different voltages and STB1~STB4 have the same logic as XTB1~XTB4 but may have different voltages.

For other memory banks not selected for erasing, both odd and even WL latches apply ground voltages to XD1 and XD2 respectively. Because the conditions of the address lines XT1~XT4 and XTB1~XTB4 have been determined by the WLs selected for erasing, WL1 and WL2 are connected to the ground voltage of XD1 and XD2 respectively, and WL3~WL8 are also passed with the ground voltage of XS. Therefore, none of the WLs is affected by the erase operation.

After a predetermined erasing time the threshold voltage of each cell on each erased WL is verified sequentially to check if the erase operation is finished. The WL to be verified is applied a positive low voltage such as 1.5V. The other erased WLs are applied a negative low voltage such as −3V to cut off all the memory cells on them even if any of the cells has been over-erased and having a threshold voltage between 0V and −3V. The cut-off negative voltage is dependent on the threshold voltages of the over-erased cells. It is detected before the erase-verification by lowering down the erased WL voltage until no memory cell current is sensed. The detail of determining the threshold voltage is disclosed in U.S. patent application Ser. No. 08/823,571 filed Mar. 25, 1997 assigned to the same assignee of this invention.

The non-selected WLs are applied a small or ground voltage, such as 0V. Assuming that WL1 of the first memory bank is verified, the address lines are applied appropriate voltages to select WL1, i.e., a power supplying voltage Vdd for XT1, −3V for XT2~XT4, −3V for XTB1 and Vdd for XTB2~XTB4. In the first memory bank where the verified WL1 is located, the odd WL latch applies the verifying voltage, i.e. 1.5V, to XD1 and the even WL latch applies the cut-off negative voltage such as −3V to XD2. Under these bias conditions, M1a and M2a as well as M1b and M2b are turned on, and M1c and M2c are turned off to pass XD1 and XD2 to WL1 and WL2 respectively. M3a~M8a as well as M3b~M8b are turned off and M3c~M8c are turned on to pass the XS signal to WL3~WL8. Therefore, WL1 is applied the verifying voltage 1.5V. WL2 is applied the cut-off voltage −3V, and WL3~WL8 are grounded in the memory bank.

In the second memory bank that has an erased WL1 which is not under verification, both odd and even WL latches apply a negative cut-off voltage −3V to XD1 and XD2 respectively. Because the address lines are shared, the bias conditions make WL1 and WL2 connected to the cut-off voltage −3V of XD1 and XD2 respectively, and WL3~WL8 passed with the ground voltage of XS. For other memory banks that have no WL selected for erasing at all, both WL latches apply 0V to XD1 and XD2 respectively. Therefore, WL1 and WL2 are grounded to 0V of XD1 and XD2 correspondingly and WL3~WL8 are grounded to 0V of XS.

After the verification, if WL1 of the first memory bank fails the erase-verification, it will be erased again with the same operation conditions that have been described earlier. If it passes the verification, WL1 will be applied a negative cut-off voltage to stop erasing and cut-off the over-erased memory cells at the same time if there are any over-erased cells. Under this situation, the operation conditions of the next erase cycle are similar to those conditions which have been described earlier except that the odd WL latch in the first memory bank will apply a negative cut-off voltage to XD1.

Based on the forgoing discussion, the present invention provides a decoder circuit for erasing multiple and random WL pairs at the same time. It should be noted that the erase operation of each individual WL is stopped independently. Because each erased WL is controlled by either an even WL latch or an odd WL latch, the erase operation of the WL that already passes the erase-verification can be stopped by resetting its corresponding WL latch to an erase-inhibit state. It is not necessary to wait for the WL that has the slowest speed of being erased to complete erasing before other WLs can be stopped erasing. The advantage of being able to stop erasing independently is that the problem associated with over-erasure of conventional flash memories is greatly reduced.

A keen reader may notice that if a pair of WLs sharing a same SL are erased simultaneously, the verified WL may suffer from false reading when it is under erase-verification unless the adjacent WL is cut off. Conventionally, the control gate of the WL not for verification is grounded. However, if a memory cell on the adjacent WL has been over-erased, it can not be shut-off by grounding its control gate. Because the over-erased memory cell conducts current and shares the same source line with the WL being verified, the erase-verification may give an incorrect result. As described in the above example, a negative cut-off voltage determined by the technique disclosed in the referenced U.S. patent application Ser. No. 08/823,571 is applied to the adjacent WL to eliminate the false reading problem.

It is also worth while to mention that the flash memory of this invention requires three control gate voltages for the WLs when erase-verification is performed. In addition to the verifying voltage and the ground voltage as used in a conventional flash memory, a negative cut-off voltage as mentioned in the previous paragraph is necessary. U.S. patent applicants Ser. No. 08/645,630 and Ser. No. 08/676,066 that both are assigned to the same assignee of this invention disclose a method for applying at least three voltages from the WL latches. The technique is incorporated in this invention for providing three different control gate voltages to the WLs.

Figure 3A:
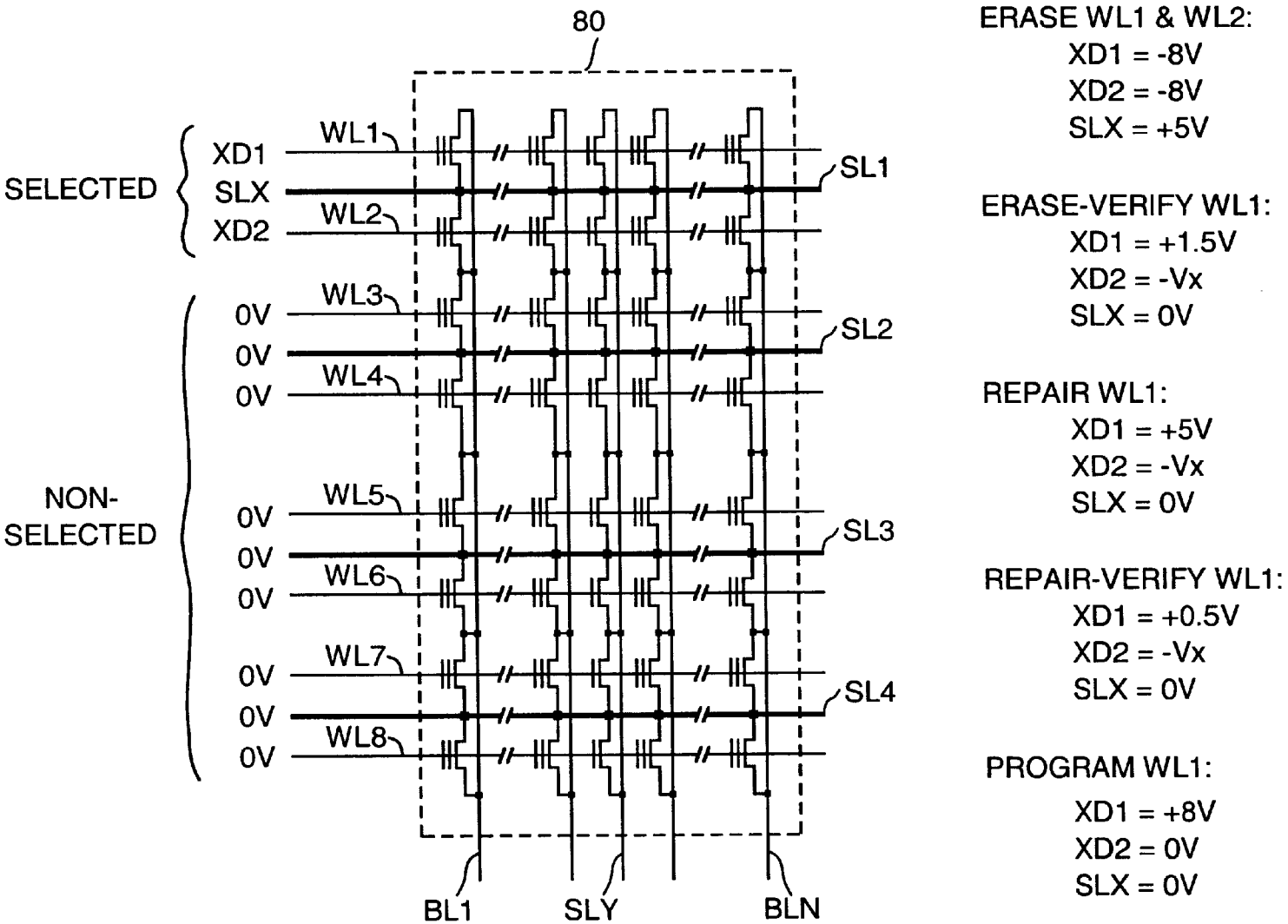
FIG. 3a shows the memory array circuit of a memory bank and the operational conditions of the decoder circuit for various memory operations.

FIG. 3a shows an example of the bias conditions for various memory operations of the word lines in one memory bank. It is assumed that both WL1 and WL2 have been selected for erasing, i.e., XD1, XD2 and SLX have been connected to WL1, WL2 and SL1 respectively by the address lines. The conditions for an erase operation and an erase-verify operation have been described in the earlier discussion in connection with FIG. 2. For erase operation, both XD1 and XD2 are −8V and SLX is 5V. For erase-verification of WL1, XD1 is +1.5V. XD2 is a negative cut-off voltage −Vx that has been assumed −3V in the earlier discussion, and SLX is 0V. For over-erase-verification of WL1, XD1 is a voltage +0.5V. XD2 is a negative cut-off voltage −Vx, and SLX if 0V. For repairing WL1, XD1 is +5V. XD2 is a negative cut-off voltage −Vx, SLX is 0V. For programming WL1, XD1 is +8V, and both XD2 and SLX are 0V.

A summary of required WL voltages of this embodiment under different operations is as follows. Three voltages are required for erase, erase-verify, over-erase-verify, and repair operations. For WLs selected for erasing, an operating voltage is applied. For a WL that is erase-verified or over-erase-verified, an erase-verify voltage or a repair voltage is applied. For a WL that has been erased but not under verification, a negative cut-off voltage is applied to shut off the WL. For WLs that have not been selected for erasing, they are grounded. It should be noted that after the repair operation, all over-erased WLs are recovered. It is not necessary to shut off the over-erased memory cells any more. Therefore, only two voltages are required for program and read operations. An operating voltage is applied to the programmed or read WL and the other WLs are grounded. A summary of the control signals for the first embodiment of this invention under different memory operations is listed in FIG. 3b.

Figure 4:
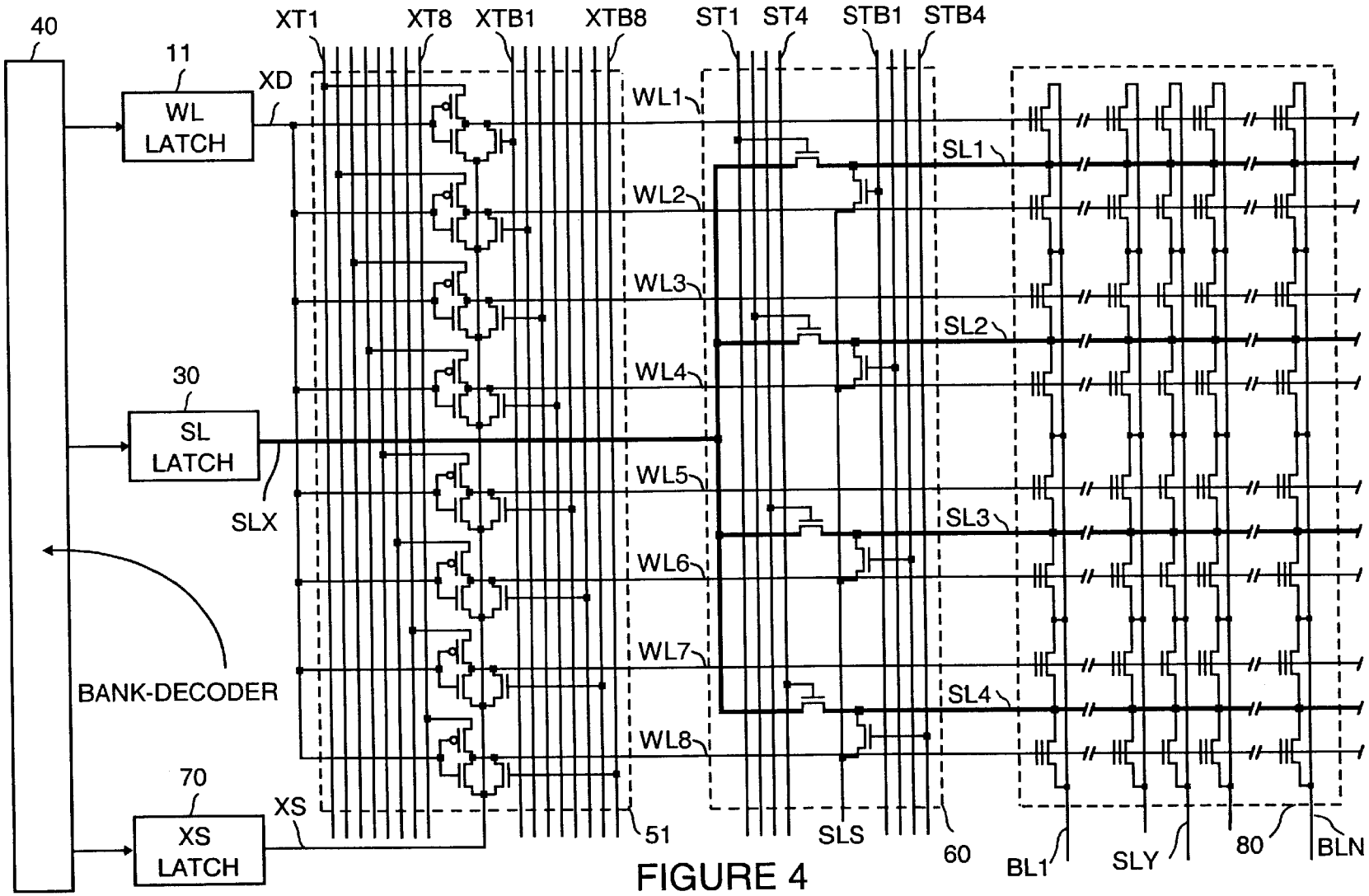
FIG. 4 shows a second embodiment of the circuit of a memory bank of the present invention including a bank decoder, a word line decoder with a word line latch and a source line decoder with a source line latch.

FIG. 4 shows a second embodiment of the present invention. In this embodiment, the flash memory circuit comprises a WL decoder 51, an SL decoder 60 and a memory bank 80 having an array of memory cells. Each memory bank has a WL latch 11, an SL latch 30, and a word control line (XS) latch 70 associated with the bank. A bank decoder 40 selects different memory banks of the flash memory. The SL decoder 60, the SL latch 30, the memory bank 80 and the bank decoder 40 are identical to those described in the first embodiment. The same numerals are also used to identify these circuit blocks. In the word line decoder 51, there are a plurality of word gating devices each having three transistors for controlling the connection of word lines. For example, WL1 is controlled by a gating device having transistors M1a, M1b and M1c. By means of the WL latch 11, the SL latch 30, and the XS latch 70, the WL decoder circuit 51 as shown in FIG. 4 can connect each WL within a memory bank to either its address line XT (one of XT1~XT4) or the XS latch 70.

If the number of WLs selected for erasing is less than the size of a memory bank, the WL latch 11 of the memory bank sends a negative voltage to XD that makes the connection of each WL in the memory bank dependent on its respective address line XT. If the address line is a negative voltage, the corresponding WL is connected to the XS latch 70 which provides a negative voltage for erasing. If the address line is grounded, the corresponding WL is also grounded. Due to less flexibility of the WL decoder 51, if the number of WLs selected for erasing is greater than the size of a memory bank, this embodiment can only erase all the WLs of one or more memory banks altogether and the erase size has to be a multiple of the size of a memory bank. In other words, if all the WLs within one memory bank have been selected for erasing, all the WLs of any other memory bank have to be either selected for erasing or not selected for erasing. Although the erase size is not as flexible as the first embodiment, it is still possible to have very flexible erase size by using two erase operations.

As can be seen from FIG. 4, two adjacent word lines share a same source line. It is difficult to avoid the memory disturbance problem. As discussed in the first embodiment, it is preferred that two adjacent WLs be erased altogether at the same time although any number of WLs less than the size of a memory bank can be selected for erasing. Therefore, the preferred mode of operation of the decoder circuit of this embodiment has an erase size being an even number less than the size of a memory bank, or a multiple of the size of a memory bank.

Figure 5A:
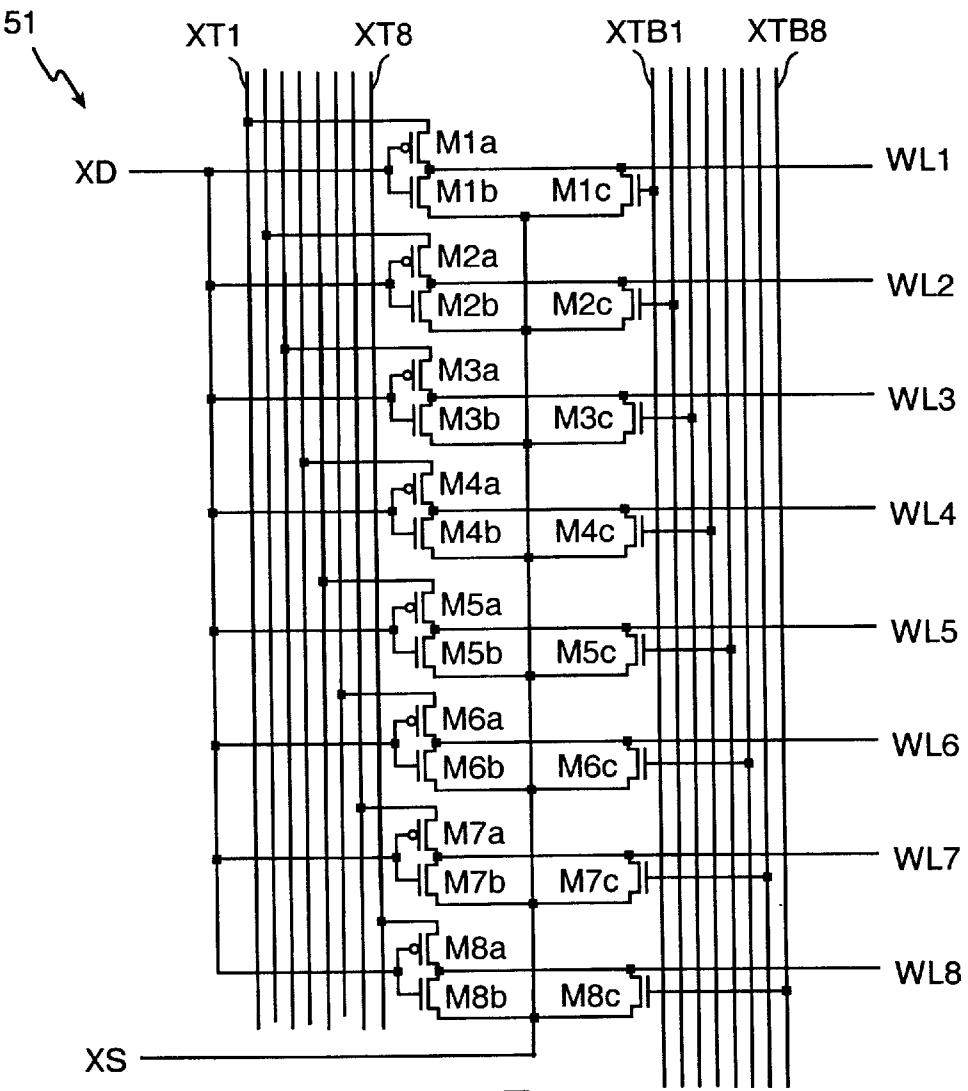
FIG. 5a shows the word line decoder circuit of the second embodiment shown in FIG. 4.

For describing the operation of the second embodiment, the WL decoder circuit 51 of a memory bank is shown again in FIG. 5a. Each memory bank has only one WL latch for generating XD signal. The XD signal is sent to the common gates of a p-n transistor pair as shown in FIG. 5a, Each address line XT is sent to the drain of a p-MOS transistor. The drains of two n-MOS transistors are tied together and connected to the XS latch 70. Therefore, either XT or XS is passed to a WL according to the XD signal. Eight WLs are shown in one memory bank in this example.

To illustrate how the decoder works, the case of selecting only a number of WLs less than the size of a memory bank for erasing is discussed first. The voltages of XTD1~XT4 are −8V, XT5~XT8 are 0V, XTB1~XTB4 and +1V, and XTB5~XTB8 are −8V to select WL1~WL4 of the memory bank for erasing. The WL latch and the XS latch of the selected memory bank apply −8V to XD and XS respectively. Under these conditions, M1a~M4a as well as M1b~M4b are turned off and M1c~M4c are turned on to pass a negative voltage −8V from XS to the selected word lines WL1~WL4. In the mean time, M5b~M8b as well as M5c~M8c are turned off and M5a~M8a are turned on to pass a 0V from XT5~XT8 to the non-selected word lines WL5~WL8.

Because XT1~XT8 and XTB1~XTB8 are shared by respective WLs in each memory bank, the bias conditions of XT1~XT8 and XTB1~XTB8 have been determined by the WLs of the memory bank selected for erasing as described in the previous paragraph. The control of the non-selected memory banks has to be accomplished by appropriate XD and XS voltages within the memory bank. For memory banks that are not selected for erasing. XD is applied −8V and XS is applied 0V. Because the voltages of its WL1~WL4 ae passed from XS as described in the previous paragraph, they are 0V. The voltages passed from XT5~XT8 to WL5~WL8 are also 0V. Therefore, all the WLs are not selected for erasing.

To stop erasing any word line of the selected WLs, the corresponding XT can be applied a negative cut-off voltage for passing to the WL. For example, if only WL1 has passed the erase-verification, a negative cut-off voltage low enough to turn off the memory cells on WL1 is applied to XT1. The negative cut-off voltage is lower than the determined threshold voltage as discussed earlier in connection with the referenced U.S. patent application Ser. No. 08/823,571. A good example of the negative cut-off voltage may be −3V. XT1B is also applied −8V. M1c is turned off and the negative bias voltage turns on M1a and passes itself to WL1. The remaining word lines WL2~WL4 are not affected and their erase operation continue.

After an erase operation for WL1~WL4, each word line can be verified individually. For verifying the word line WL1, a verifying voltage such as +1.5V is applied to XT1, XT2~XT4 are applied a negative cut-off voltage −3V and XT5~XT8 are applied 0V. XTB1 is applied a negative cut-off voltage −3V, XTB2~XTB4 are applied 0V and XTB5~XTB8 are applied a negative cut-off voltage −3V. Both XD and XS are applied a negative cut-off voltage −3V from the WL latch and the XS latch respectively. Under these conditions, M2a~M4a as well as M2b~M4b are turned off and M2c~M4c are turned on to pass the negative cut-off voltage −3V from XS to word lines WL2~WL4 that are erased but not under verification. In the mean time, M5b~M8b as well as M5c~M8c are turned off and M5a~M8a are turned on to pass a 0V from XT5~XT8 to the non-selected word lines WL5~WL8. M1b as well as M1c are turned off and M1a is turned on to pass the verifying voltage +1.5V from XT1 to WL1 for verification.

As mentioned before, the second embodiment also allows the erasing of multiple memory banks all at once. All the WLs of each selected memory bank must be erased or stopped together. For the case of erasing multiple memory banks, XT1~XT8 are applied 0V and XTB1~XTB8 are applied either −8V or 0V. For each memory bank selected for easing, the corresponding WL latch applies 0V to XD and the corresponding XS latch applies −8V to XS. Under this circumstance, M1a~M8c are turned off and M1b~M8b as well as M1e~M8c are turned on. Therefore, WL1~WL8 are applied a voltage −8V passed from XS for erasing. For each memory bank not selected for erasing, the corresponding WL latch applies −8V to XD and the corresponding XS latch applies 0V to XS. Consequently, M1a~M8a are turned on and M1b~M8b as well as M1c~M8c are turned off. WL1~WL8 are applied 0V passed from XT1~XT8 respectively.

Although the WLs of each selected memory bank must be erased or stopped together, it is possible that one memory bank is stopped erasing while the other memory bank continues its erase operation. When it is necessary to stop a selected memory bank, the XS latch applies a negative cut-off voltage as discussed before, such as −3V, to XS. The negative cut-off voltage at XS is passed to all the WLs in the memory bank to shut off the memory cells because M1a~M8a are turned off and M1b~M8b as well as M1c~M8c are turned on.

Each erased WL has to be verified individually. If WL1 of a memory bank is to be verified, XT1 is applied a verifying voltage +1.5V and XT2~XT8 are applied a negative cut-off voltage −3V. XTB1 is applied a negative cut-off voltage −3V and XTB2~XTB8 are applied 0V. For the memory bank having the verified WL1, both XD and XS are applied a negative cut-off voltage −3V from the WL latch and the XS latch respectively. Under these conditions, M2a~M8a as well as M2b~M8b are turned off and M2c~M8c are turned on to pass the negative cut-off voltage −3V from XS to word lines WL2~WL8 that are erased but not under verification. In the mean time, M1b as well as M1c are turned off and M1a is turned on to pass the verifying voltage +1.5V from XT1 to WL1 for verification.

For other memory banks that have been erased but not under verification, the corresponding WL latch applies +1V to XD and the corresponding XS latch also applies a negative cut-off voltage −3V to XS. Under this circumstance, M1a~M8a are turned off and M1b~M8b are turned on. M1c is turned off and M2c~M8c are turned on. It can be understood that all the word lines WL1~WL8 are applied the negative cut-off voltage −3V passed from XS so that the verification of WL1 in the selected memory bank is not disturbed. For each memory bank not selected for erasing, the corresponding WL latch applies +1V to XD and the corresponding XS latch applies 0V to XS. Consequently, M1a~M8a are turned of and M1b~M8b are turned on. M1c is turned on and M2c~M8c are turned off. The circuit condition also allows WL1~WL8 to be applied 0V passed from XS. FIG. 5b summarizes the control signals for the second embodiment of this invention under different memory operations.

Figure 6:
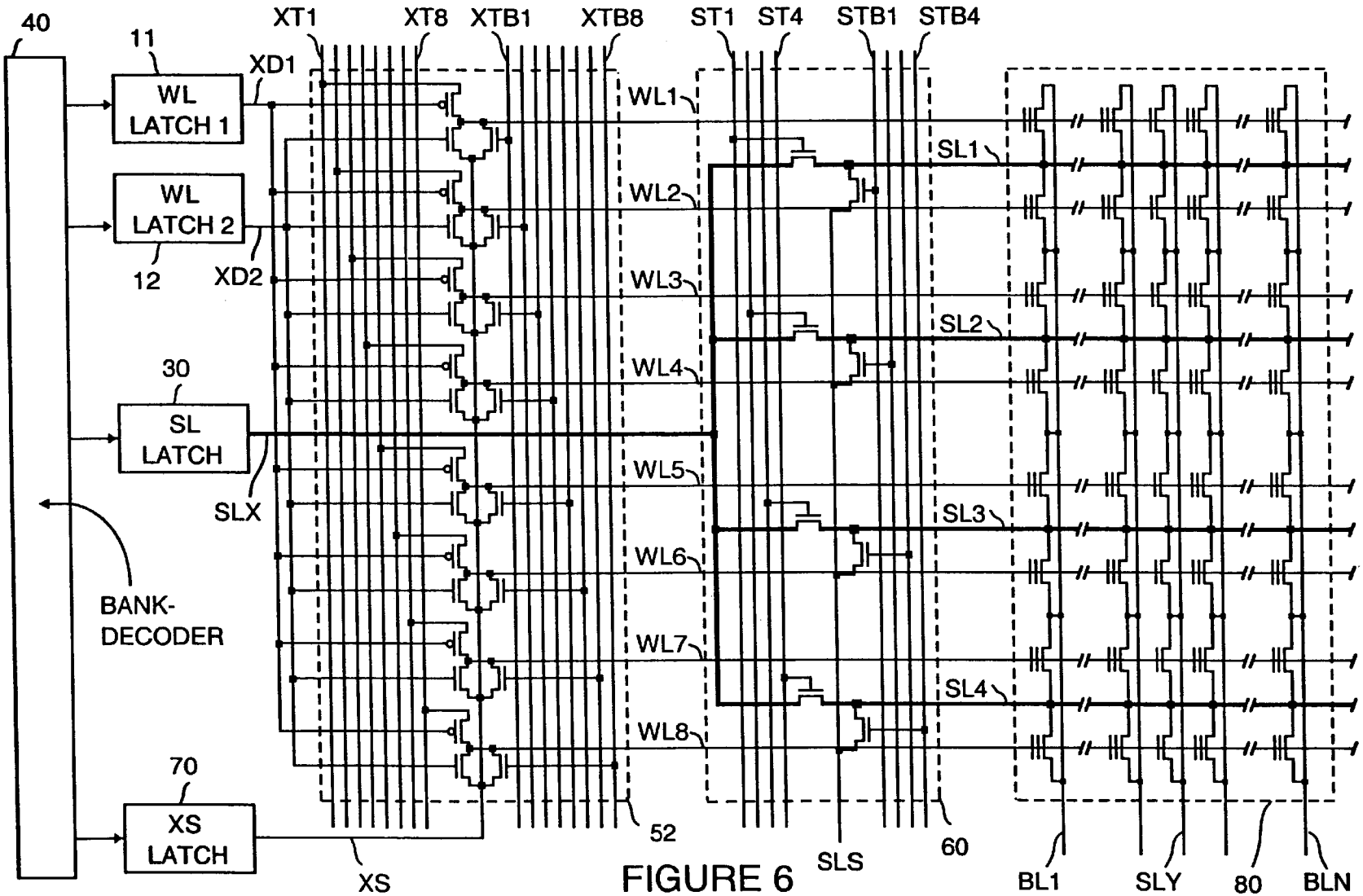
FIG. 6 shows a third embodiment for the circuit of a memory bank of this invention.

FIG. 6 shows a third embodiment of the invention. In this embodiment, the flash memory circuit comprises a WL decoder 52, an SL decoder 60 and a memory bank 80 having an array of memory cells. Each memory bank has a first WL latch 11, a second WL latch 12, an SL latch 30, and an XS latch 70 associated with the bank. A bank decoder 40 selects different memory banks of the flash memory. This embodiment is almost identical to the second embodiment described earlier except that two WL latches are used to send XD1 and XD2 signals to the gates of the p-MOS transistor and n-MOS transistor in the WL decoder 52 respectively. This embodiment offers some protection on the p-n transistors in certain cases because the two gates of each p-n transistor pair are not connected together and the two WL latches can provide different voltages. As an example, XD2 can be applied +1V for turning on the n-MOS transistor in order to pass XS signal to a WL and the p-MOS transistor can be shut off by applying 0V to XD1 to avoid being broken down due to a large voltage difference between its source and gate.

Figure 7:
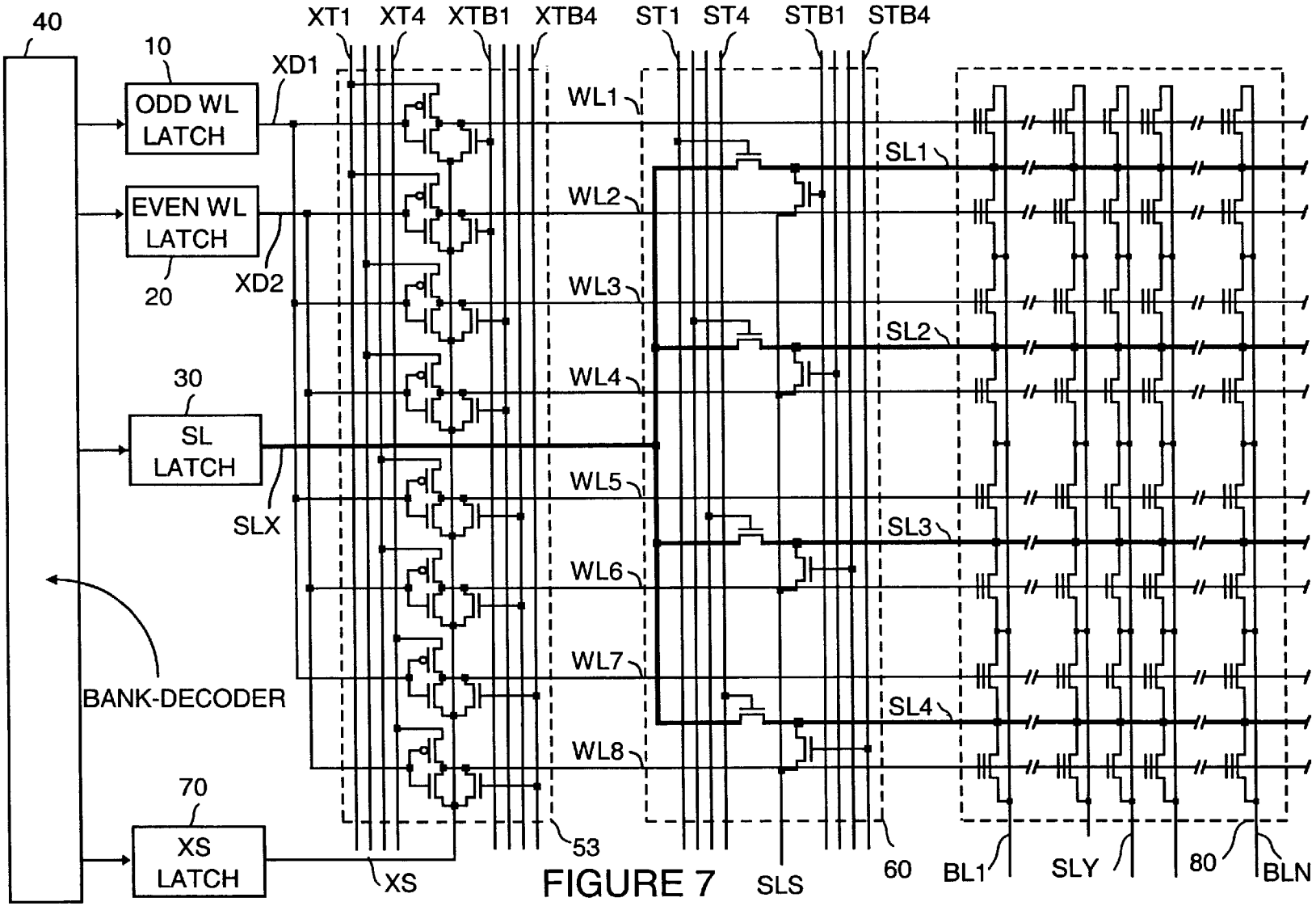
FIG. 7 shows a fourth embodiment for the circuit of a memory bank of this invention.

FIG. 7 shows a fourth embodiment of this invention. In this embodiment, the flash memory circuit comprises a WL decoder 53, an SL decoder 60 and a memory bank 80 having an array of memory cells. Each memory bank has an odd WL latch 10, an even WL latch 20, and SL latch 30, and an XS latch 70 associated with the bank. A bank decoder 40 selects different memory banks of the flash memory. This embodiment is also very similar to the second embodiment except that even and odd WL latches are used to control even and odd WLs separately in the memory bank. As shown in FIG. 7, only half of the address lines are required in the WL decoder 53 of this embodiment. In other words, each pair of WLs controlled by odd and even WL latches share an address line of XT1~XT4. Compared to the second embodiment, the additional WL latch 20 saves half of the address lines for this embodiment but provides equivalent decoding function.

Figure 8:
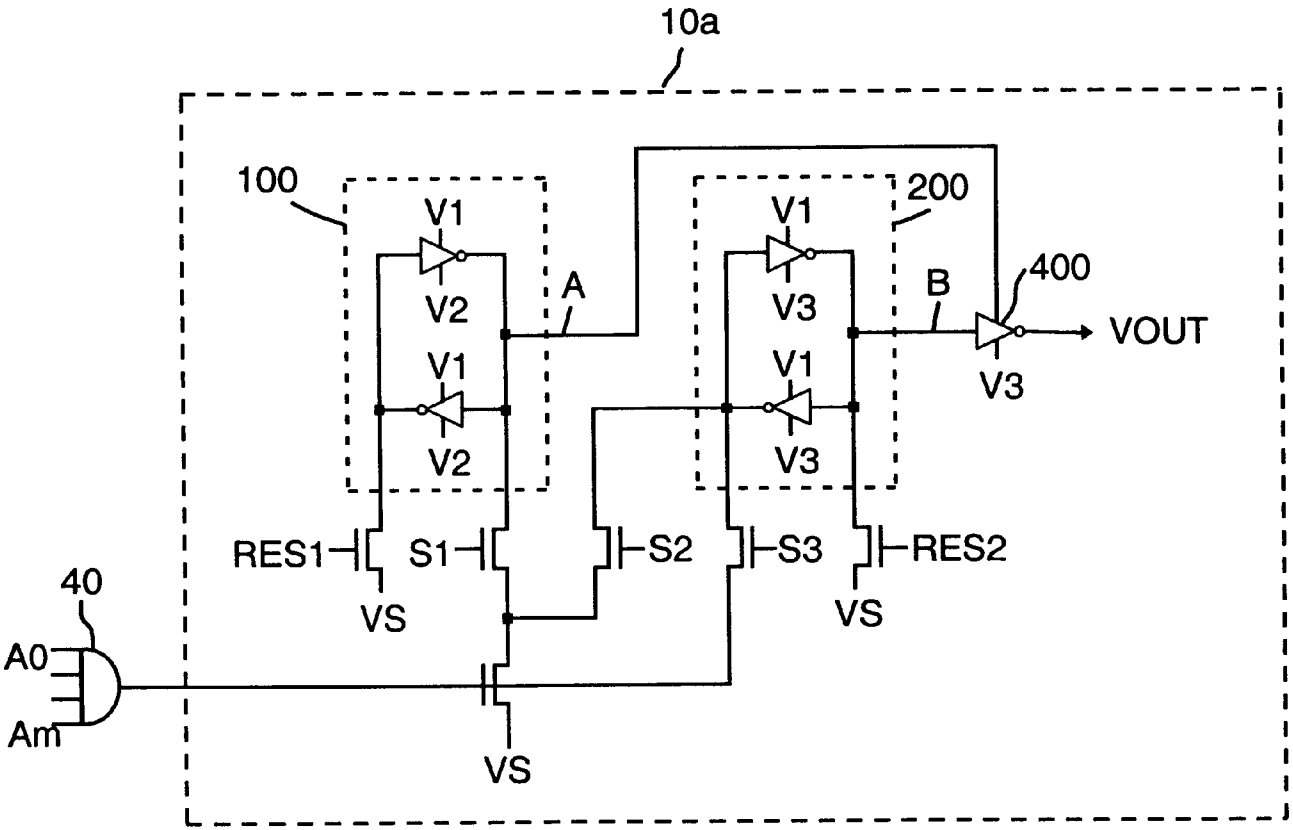
FIG. 8 shows a latch circuit for providing three voltage levels.
Figure 9:
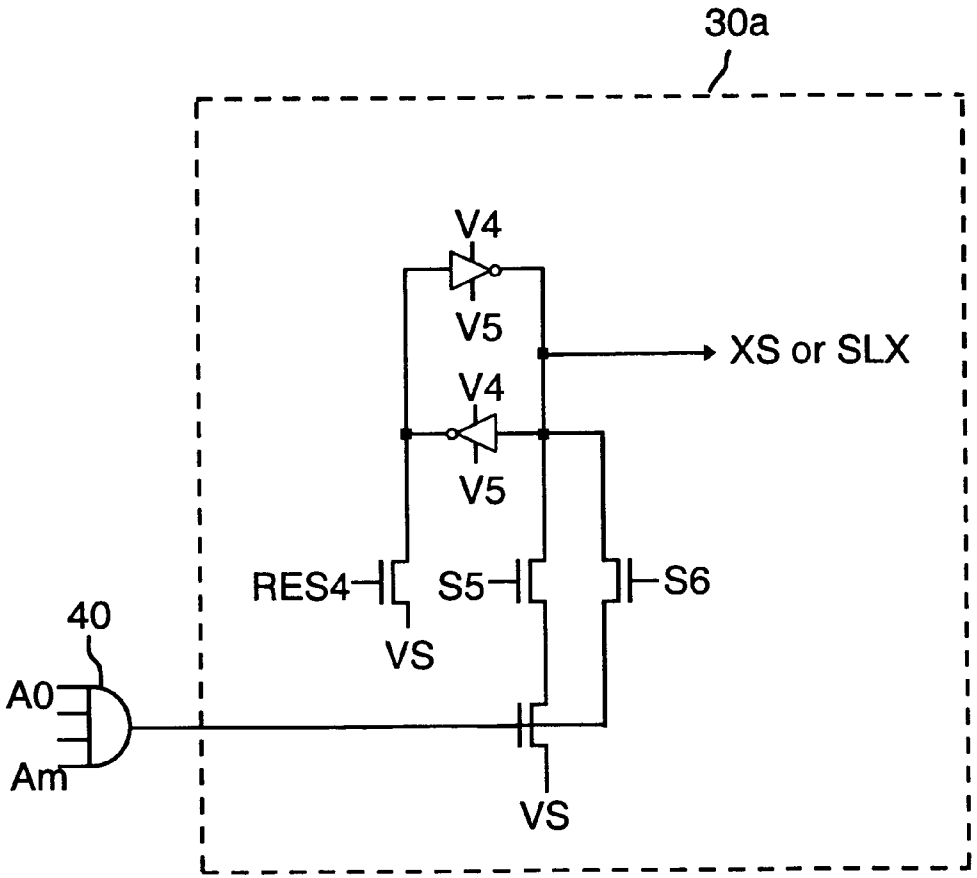
FIG. 9 shows a latch circuit for providing two voltage levels.

It should be noted that all the embodiments of this invention require that three different voltages be available to control signals such as XD in the first embodiment or XT in second, third and fourth embodiments for operation. An earlier U.S. patent application Ser. No. 08/676,066 assigned to the same assignee of this invention discloses a latch circuit that can provide three different voltages. Another U.S. patent application Ser. No. 08/823,571 assigned to the same assignee of this invention discloses methods of memory operations by applying different voltages for avoiding over-erasure problems. The WL latches of this invention uses the latch circuit and the methods described in the referenced applications. An example of such a latch circuit is shown in FIG. 8. The circuit comprises first 100 and second 200 latches, and an output driver 400. If the first latch 200 stores a high voltage level for point B, the output driver 400 provides V3 to VOUT. Otherwise, the output drive provides V1 or V2 according to the high or low voltage level stored in the latch 100 for point A. RES1, RES2, S1, S2 and S3 are control signals for setting and resetting the latch circuit as well as controlling it for proper operations under different modes. Some of signal lines of this invention such as XS, SLX and XD in the second embodiment and XT in the first embodiment require latches that can provide two voltages. An example of a two voltage latch as shown in FIG. 9 can be used. The operation of the latch is similar to that of FIG. 8 except that only two voltage levels are available.

According to this invention, a source line is shared by every two adjacent WLs as shown in the embodiments of FIGS. 1,4,6, and 7. In the memory array, each WL also has an n-transistor of which the gate is coupled to the WL, the source is connected to the shared source line and the drain is connected to a common SLY line as shown in FIGS. 1,4, 6 and 7. The n-transistor is denoted as M100 in FIG. 1. The common SLY line and the transistor M100 for the source lines serve to drain large cell current of multiple bits in parallel when it is required during program operation of the flash memory array. Therefore, for the layout of the circuit, a narrow metal line of one word line width can be used for each source line. A prior art paper titled "A new Decoding Scheme and Erase Sequence for 5V Only Sector Erasable Flash Memory", published in 1992 Symposium on VLSI Circuits Digest of Technical Papers by Mitsubishi shows a flash memory using a wide metal line of four word line width for two source lines due to a large cell current required during program. The common SLY line and the transistor M100 in this invention make it possible to use a narrow metal line for a shared source line.

Figure 10A:
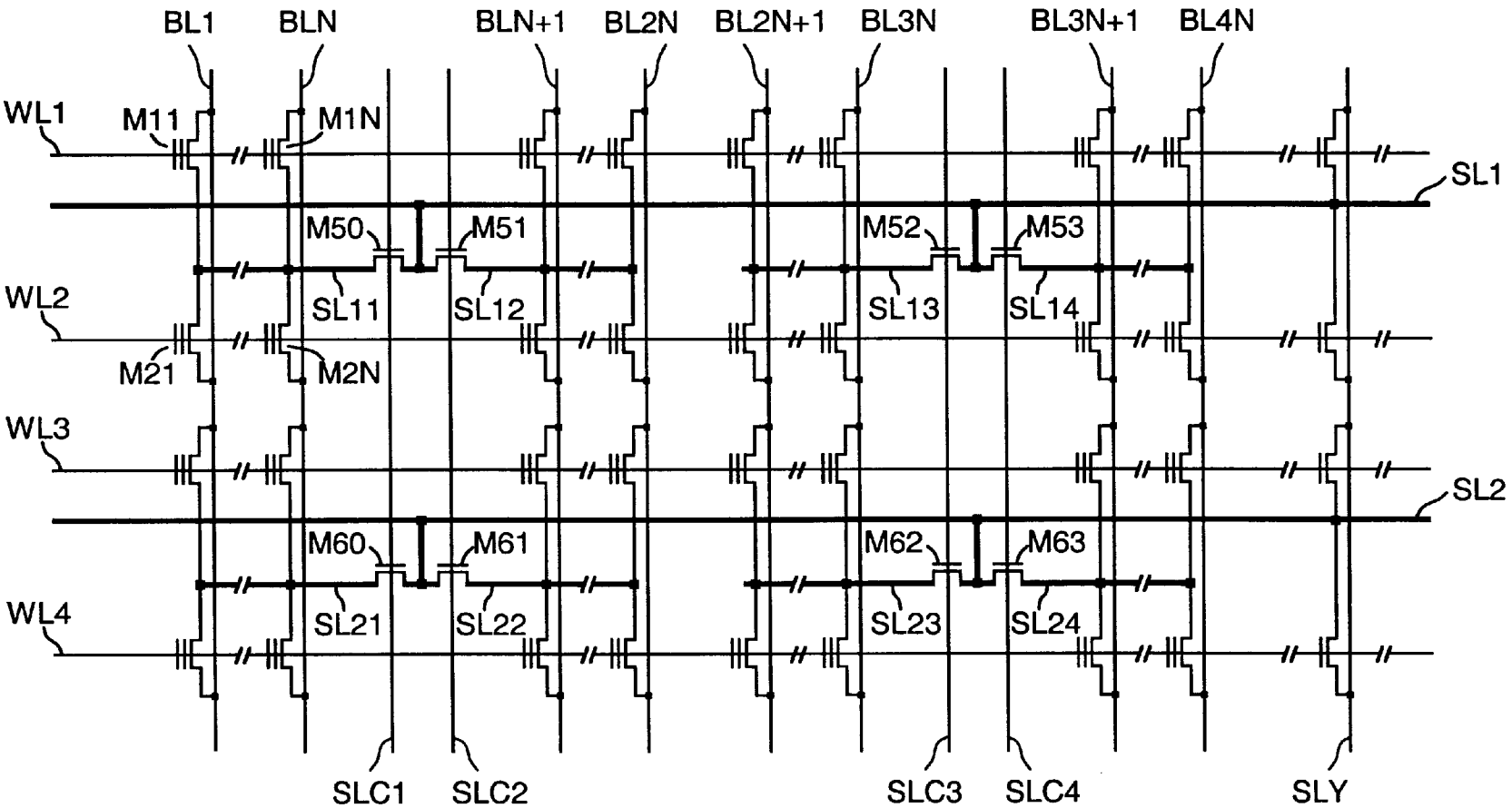
FIG. 10a shows a memory array circuit having segmented source lines of this invention.
Figure 10B:
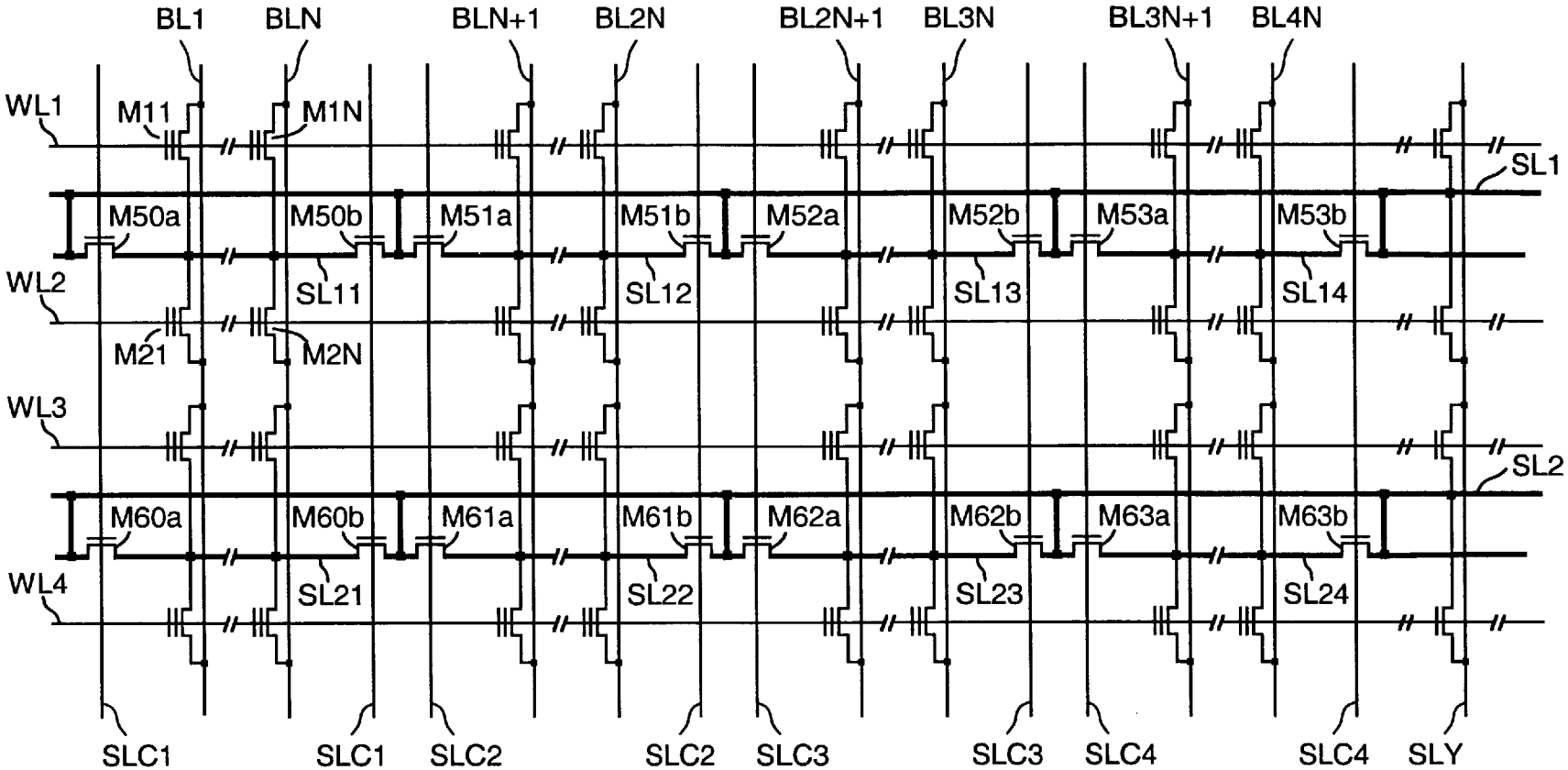
FIG. 10b shows an alternative memory array circuit having segmented source lines of this invention.

The four embodiments described so far provide the erasure of a flexible number of WLs from two to a large number of WLs. The invention further provides an innovative way of dividing A WL pair into a plurality of segments so that the memory cells in each segment of the WL pair can be selectively erased. As shown in FIG. 10a, it is assumed that the memory cells in the memory array have a number of bit lines BL1, BL2, . . . BLN, BL(N+1), . . . BL(2N), . . . and so on. The word line pair WL1 and WL2 are divided into a plurality of segments each having N bit lines. Take the first segment having bit lines BL1, BL2, . . . BLN as an example. The sources of these memory cells are wired together to form a segmented source line SL11 and then connected to the source line SL1 through an n-MOS transistor M50. Similarly, the source of the memory cells on the first segment of WL3 and WL4 pair are wired together to form a segmented source line SL12 and then connected to the source line SL2 through another n-MOS transistor M60. The gates of the n-MOS transistors M50 and M60 are connected to a source segment control line SLC1. The control line SLC1 determines if M50 or M60 should be turned on to connect the corresponding segmented source line SL11 or SL12 to SL1 or SL2 respectively. By controlling the voltage on SLC1, this invention further provides the capability of erasing only a segment of memory cells on each WL. In other words, sub-WL erasing capability is accomplished by the circuit structure as shown in FIG. 10a. FIG. 10b shows an alternative circuit structure for providing segmented source lines. In FIG. 10b, each segmented source line such as SL11 has two source segment control lines running on both sides of the segment (but connected to the same control line voltage SLC1) and two transistors M50a and M50b to control the connection of SL11 to SL1. To achieve multiple and flexible segment erasing, a method of using an SLCN Latch for each SLCN signal can be applied. The detail of this method of operation has been disclosed in a U.S. patent application Ser. No. 08/624,322 assigned to the same assignee of this invention.

Figure 11:
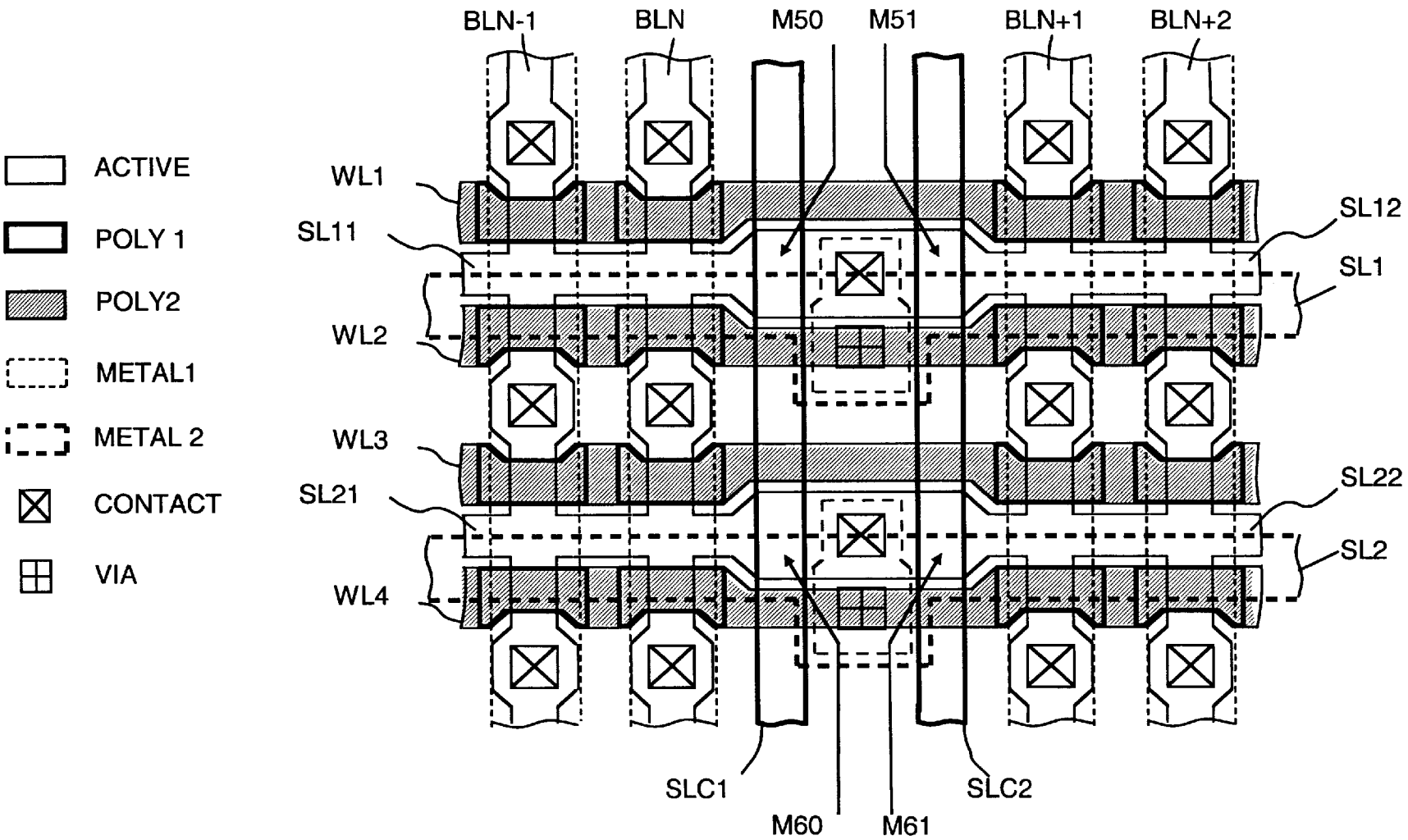

A prior art U.S. Pat. No. 4,949,309 discloses a similar but different source line circuit that also has two transistors controlling the circuit. In the layout shown in U.S. Pat. No. 4,949,309, a first metal layer is used for both bit lines and source lines that run vertically, and the controlling transistors are constructed with a second polysilicon (Poly2) layer. An exemplary layout of the circuit structure of FIG. 10a is shown in FIG. 11. The layout shows two segments of four WLs, SLC1 and SLC2 are the source segment control lines of the first and second segments respectively. In the layout of a flash memory circuit, a first polysilicon (Poly1) layer is used to form the floating gates of the memory cells and the second polysilicon (Poly2) layer is used for the word lines. Due to the high density, there is no space available for building other transistors with the Poly2 layer. This invention presents the layout as shown in FIG. 11 in which the source segment control lines SLC1 and SLC2 as well as the transistors M50 and M60 are constructed with the Poly1 layer. Because in the flash memory technology the Poly1 layer is used to form the isolated floating gate of all memory cells, the Poly1 layer without the mask of Poly2 layer is etched away. This is done by using a self-aligned etching (SAE) technique with a special SAE mask. In this invention, however, the transistors M50 and M60 as well as control lines SLC1 and SLC2 have to be protected from being etched away. Therefore, the traditional SAE layer can be modified to exclude these Poly1 devices and Poly1 gate lines from the regular Poly1 lines which are overlapping with the first metal lines of bit lines. No extra mask is required.

In principle, the source segment control transistors M50 and M60 and the source segment control lines SLC1 and SLC2 should be formed in a polysilicon layer separated from the polysilicon layer of forming the word lines and control gates of the memory cells. As described in the previous section. Poly1 layer can be used for fabricating them. However, it is necessary to increase the thickness of the Poly1 layer. To improve the device performance and quality of the flash memory device, an additional polysilicon layer may also be used for the source segment control lines and transistors in the fabrication process. This additional polysilicon layer can be either below or above the Poly2 layer which is typically for forming the word lines.

Figure 12:
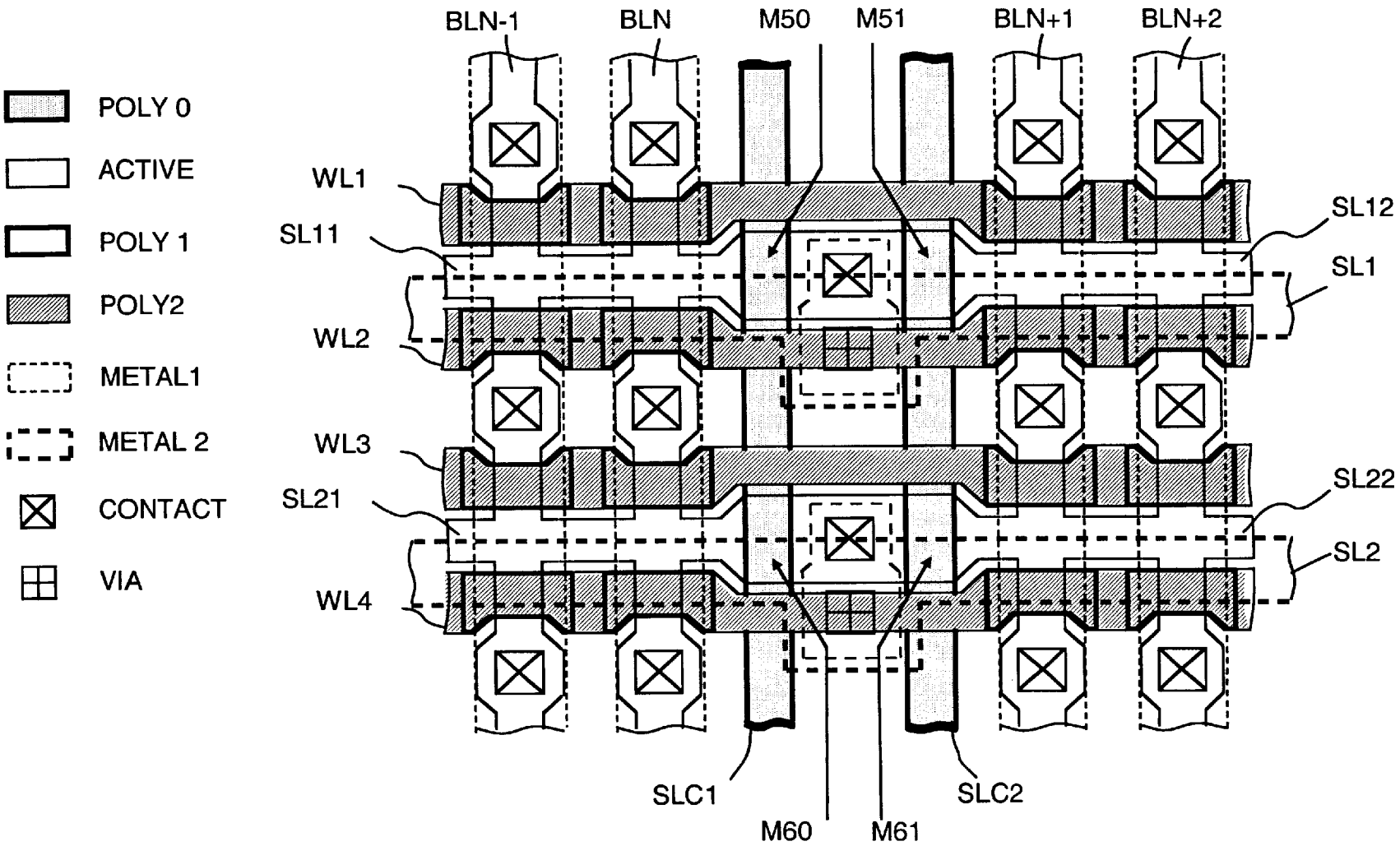

FIG. 12 shows another layout of this invention for the circuit structure of FIG. 10a. An additional polysilicon (Poly0) layer different from the Poly2 layer is used to form the source segment control transistors M50 and M60 and the source segment control lines SLC1 and SLC2 first. The floating gates of the flash memory cells are still formed on the Poly1 layer. The control gates and the word lines are then formed on the Poly2layer. Compared to FIG. 11, this layout has the advantage that the Poly1 layer can be made thinner without doping to avoid the degradation of the memory cell's performance.

The Poly1 layer is a thin oxide layer whose thickness is around 100 angstroms. The Poly0 layer can be doped and made thicker for better contact connection and lower interconnection resistance. As pointed out earlier, the additional polysilicon layer may also be a layer such as Poly3 above the Poly2 layer. Under this circumstance, the source segment control lines and transistors are formed on the Poly2 layer after the floating gates, the control gates and the word lines have been formed.

The above embodiments show how to manufacture the source segment control lines and transistors with a polysilicon layer above or below the Poly2 layer, namely Poly0, Poly1 or Poly3, respectively. By using another polysilicon layer rather than the Poly2 layer where the control gates are formed, the source segment control devices can be realized without increasing the word line pitch. Nonetheless, using Poly1 layer has the disadvantage that the thickness of Poly1 layer has to be increased. Using Poly0 and Poly3 layer increases the process complexity because of the additional layer.

Figure 13:
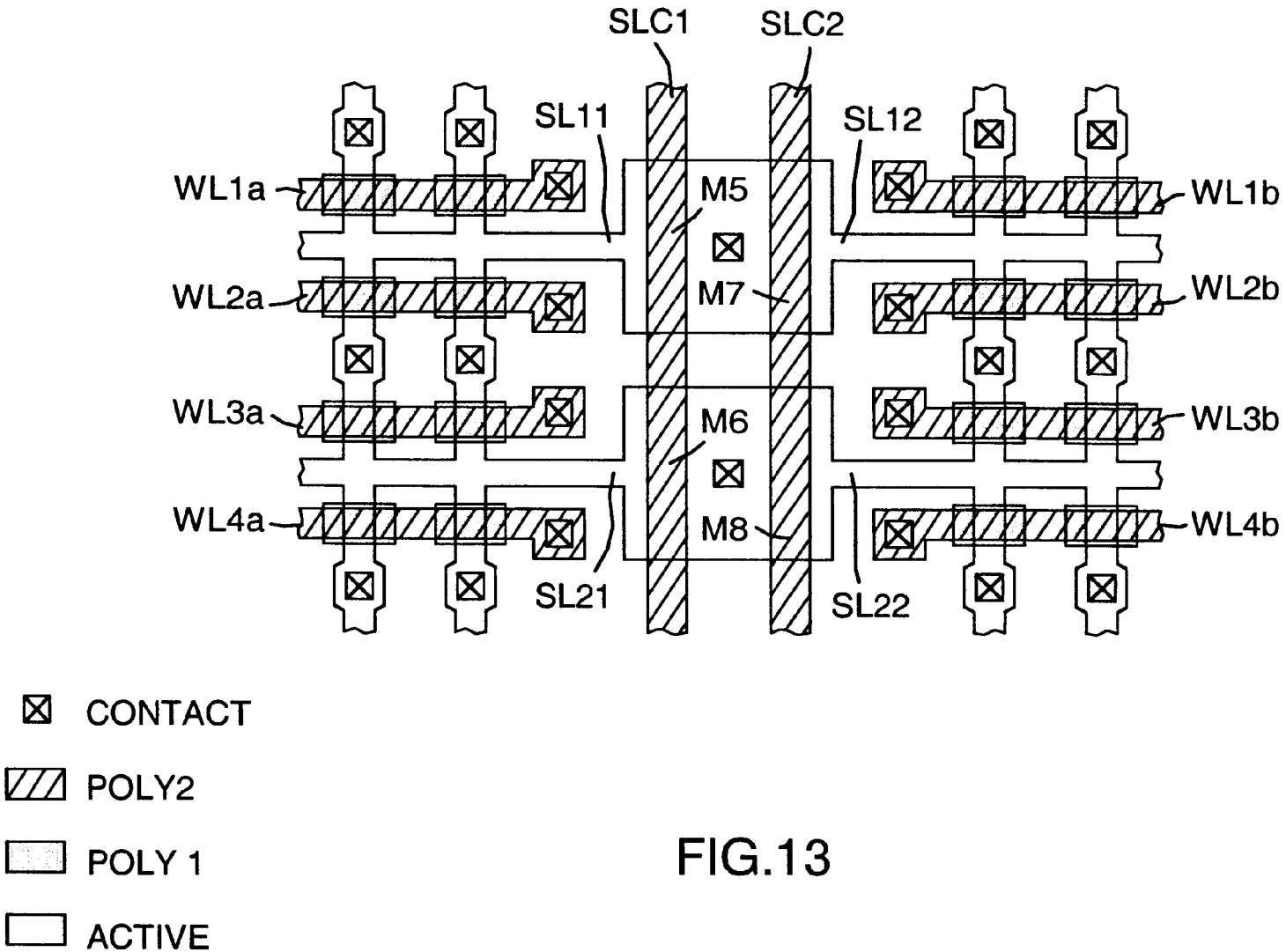
FIG. 13 shows the first few layers of an alternative layout in which a word line is divided into multiple segments in a Poly2 layer so that the source segment control transistors can be laid out using the Poly2 layer.

In order to maintain the performance and quality of the flash memory device and reduce the process complexity in manufacturing them, this invention further presents a novel layout structure for the control gates and the word lines in the Poly2 layer. With this new layout structure, it becomes possible to fabricate the source segment control lines and transistors in the Poly2 layer without increasing the word line pitch. With reference to FIG. 13, the word lines of the memory device are first fabricated as a plurality of word line segments WL1a, WL1b, WL2a, WL2b, . . . , and so on in the Poly2 layer. Because of the disconnection of the word lines, the source segment control lines SLC1 and SLC2 as well as transistors M50, M60, M51 and M61 can also be formed in the Poly2 layer without conflict.

Figure 14:
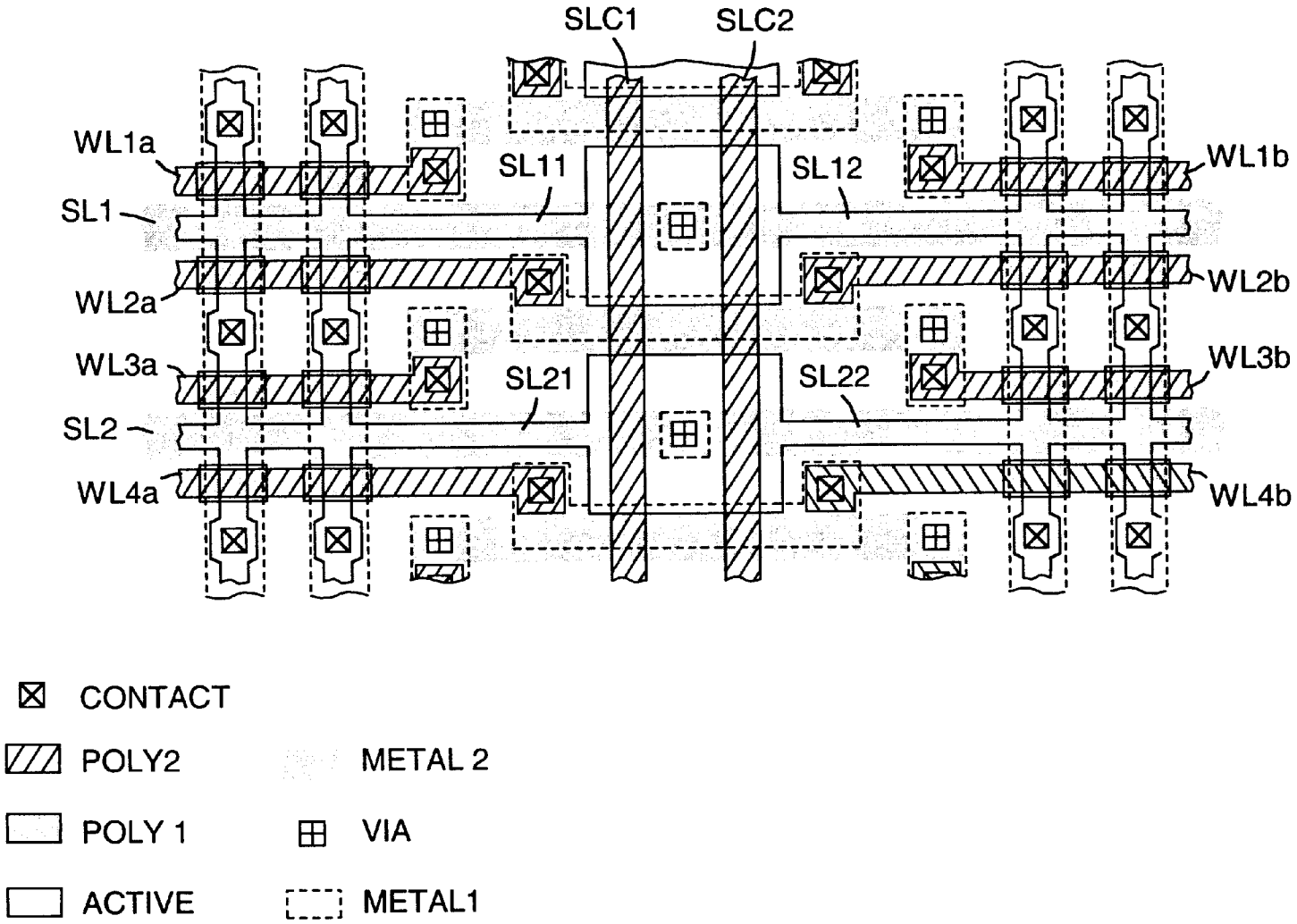
FIG. 14 shows that the adjacent word line segments in the Poly2 layer of a same word line for the alternative layout of FIG. 13 are connected either by a Metal1 or Metal2 layer.

As shown in FIG. 13, the Poly2 layer of SLC1 and SLC2 is running in the vertical direction and the transistors M50, M60, M51, and M61 are formed by SLC1 and SLC2. The Poly2 layer of the segments of the word lines is running in the horizontal direction. All the segments of a same word line are then connected by an available material, such as Metal1layer or Metal2 layer in the later process as illustrated in FIG. 14. The new layout technique, which divides a word line into plurality of segments, in Poly2 layer and then reconnects it using other metal layer, as disclosed in the present invention makes it possible to fabricate the source segment control lines and transistors by using Poly2 layer. It is important to point out that in the conventional memory design, none of the prior arts ever teaches or implements the idea of dividing the word line into segments.

FIG. 14 shows one exemplary embodiment of the new layout of this invention, where Metal2 layer is used to connect the word line segments WL1a and WL1b, and Metal1 layer is used to connect WL2a and WL2b, and so on. Although Metal1 and Metal2 layers are used in this example, a person skilled in the art can understand that the material of the interconnection should not be constrained. Any available material that can be used as connection in semiconductor device can be used in the invention. For example, the interconnection can be done by Metal1 layer, Metal2 layer, Metal3 layer, Metal14 layer, Poly3 layer, Poly4 layer, or Poly5 layer . . . , etc. All the above materials are commonly used in the semiconductor process today.

In addition, there are different methods for connecting the word line segments. For example, FIG. 15a and FIG. 15b shows two possible connection of the word line segments. For easier demonstration, the figures only show Poly2 layer of a word line and the Poly2 layer of the source segment control transistors. A person skilled in the art can understand, in reality, there is a plurality of bit lines, formed by Metal1 layer running in the vertical direction, located in each word line segment.

In FIG. 15a, the word line segments, WL1a, WL1b and WL1c are connected at the end of each segment by Metal2 segments, 10a and 10b. Alternatively, FIG. 15b shows another way of connecting the word line segments by using a continuous Metal2 layer 20a. As is well known, the connection shown in FIG. 15b has faster read speed than that of FIG. 15a because Metal2 layer has much lower resistance than Poly2 layer. Please note, FIG. 15a and FIG. 15b only show two examples of the interconnection, In fact, many combinations, such as using both the connections shown in FIG. 15a and FIG. 15b in connecting multiple segments of a word line, can be also used without departing from the spirit of the invention.

The advantage of the using Poly2 layer to form the source segment control transistors is that the process of the manufacturing can be simplified. Because it does not require an additional Poly0 or Poly3 to form the source segment transistors, the process is compatible to the conventional flash memory process that used Poly1 and Poly2 only.

What is claimed is:

1. A flash memory array, which is divided into a plurality of memory segments, comprising:

a plurality of flash memory cells being arranged in a plurality of rows and a plurality of columns, each of the memory segments having at least one column and each of said flash memory cells having a control gate, a floating gate, a drain and a source, said floating gate being formed in a first polysilicon layer and said control gate being formed in a second polysilicon layer;

a plurality of odd word lines formed in said second polysilicon layer, each odd word line connecting the control gates of all the flash memory cells in a same odd row;

a plurality of even word lines formed in said second polysilicon layer, each even word line connecting the control gates of all the flash memory cells in a same even row and forming a word line pair with a neighboring odd word line;

a plurality of bit lines each connecting the drains of all the flash memory cells in a same column;

a plurality of source lines each being associated with a word line pair; and a plurality of segmented source lines in each memory segment, each of said segmented source lines being formed by wiring together the sources of all the memory cells in a word line pair within a memory segment and then connected to the source line associated with the word line pair through at least one source segment control transistor having a gate coupled to a source segment control line of the memory segment, said source segment control line and said source segment control transistor being formed in a third polysilicon layer.

2. The flash memory array according to claim 1, said third polysilicon layer being a polysilicon layer different from said second polysilicon layer.

3. The flash memory array according to claim 1, said third polysilicon layer being a polysilicon layer below said second polysilicon layer.

4. The flash memory array according to claim 1, said third polysilicon layer being a polysilicon layer above said second polysilicon layer.

5. A flash memory array, which is divided into a plurality of memory segments, comprising;

a plurality of flash memory bells being arranged in a plurality of rows and a plurality of columns, each of the memory segments having at least one column and each of said flash memory cells having a control gate, a floating gate, a drain and a source, said floating gate being formed in a first polysilicon layer and said control gate being formed in a second polysilicon layer;

a plurality of odd word lines, each odd word line comprising;

a plurality of odd word line segments formed in said second polysilicon layer, each odd word line segment connecting the control gates of all the flash memory cells in a same odd row in a memory segment; and a plurality of word line segment connectors formed in a first conductive layer for connecting said odd word line segments in a same odd row and forming an odd word line;

a plurality of even word lines, each even word line forming a word line pair with a neighboring odd word line and comprising:

a plurality of even word line segments formed in said second polysilicon layer, each even word line segment connecting the control gates of all the flash memory cells in a same even row in a memory segment; and a plurality of word line segment connectors formed in a second conductive layer for connecting said even word line segments in a same even row and forming an even word line;

a plurality of bit lines each connecting the drains of all the flash memory cells in a same column;

a plurality of source lines each being associated with a word line pair; and a plurality of segmented source lines in each memory segment, each of said segmented source lines being formed by wiring together the sources of all the memory cells in a word line pair within a memory segment and then connected to the source line associated with the word line pair through at lest one source segment control transistor having a gate coupled to a source segment control line of the memory segment, said source segment control line and said source segment control transistor being formed in said second polysilicon layer.

6. The flash memory array according to claim 5, wherein said first conductive layer is a polysilicon or metal layer different from said second polysilicon layer.

7. The flash memory array according to claim 5, wherein said second conductive layer is a polysilicon or metal layer different from said second polysilicon layer.

8. The flash memory array according to claim 5, wherein said first and second conductive layers are a same polysilicon or metal layer which is different from said second polysilicon layer.

9. The flash memory array according to claim 5, wherein said word line segment connectors for connecting the odd word line segments in a same odd row are in series and form a connector line in said first conductive layer.

10. The flash memory array according to claim 5, wherein said word line segment connectors for connecting the even word line segments in a same even row are in series and form a connector line is said second conductive layer.

*11. A flash memory comprising:*

*a plurality of flash memory cells arranged in rows and columns, each of the flash memory cells having a control gate, a drain, and a source;*

*a plurality of word lines, each of the word lines coupled to the control gates of flash memory cells in a same row;*

*a plurality of bit lines, each of said bit lines coupling the drains of flash memory cells in a same column;*

*a plurality of segmented source lines, each of said segmented source lines coupling the sources of flash memory cells in a respective segment; and*

*at least one control transistor, including a gate node, associated with each segmented source line to control application of voltage to each segmented source line;*

*wherein said gate node of said control transistor and a control gate of said flash memory cell are coupleable to different signals.*

*12. The flash memory of claim 11, further comprising:*

*a source line coupled to at least one said control transistor associated with each segmented source line; and*

*a source line control line coupled to each said control transistor associated with each segmented source line.*

*13. The flash memory of claim 11, wherein:*

*said flash memory is divided into segments that correspond to the segmented source lines.*

*14. The flash memory of claim 12, wherein:*

*said flash memory is divided into segments that correspond to the segmented source lines.*

* * * * *